US 7,993,964 B2

(12) United States Patent
Hirao et al.

(10) Patent No.: US 7,993,964 B2
(45) Date of Patent: Aug. 9, 2011

(54) MANUFACTURING METHOD OF SEMICONDUCTOR DEVICE INCLUDING ACTIVE LAYER OF ZINC OXIDE WITH CONTROLLED CRYSTAL LATTICE SPACING

(75) Inventors: Takashi Hirao, Kochi (JP); Takahiro Hiramatsu, Kochi (JP); Mamoru Furuta, Kochi (JP); Hiroshi Furuta, Kochi (JP); Tokiyoshi Matsuda, Kochi (JP)

(73) Assignees: Kochi Industrial Promotion Center, Kochi-shi (JP); Casio Computer Co., Ltd., Tokyo (JP)

( * ) Notice: Subject to any disclaimer, the term of this patent is extended or adjusted under 35 U.S.C. 154(b) by 42 days.

(21) Appl. No.: 12/509,852

(22) Filed: Jul. 27, 2009

(65) Prior Publication Data
US 2009/0286351 A1 Nov. 19, 2009

Related U.S. Application Data

(62) Division of application No. 11/809,858, filed on Jun. 1, 2007, now Pat. No. 7,598,520.

(30) Foreign Application Priority Data

| Jun. 2, 2006 | (JP) | 2006-155188 |
| Jun. 2, 2006 | (JP) | 2006-155189 |
| Feb. 16, 2007 | (JP) | 2007-037176 |

(51) Int. Cl.
*H01L 21/16* (2006.01)
*H01L 21/00* (2006.01)
*H01L 21/84* (2006.01)

(52) U.S. Cl. ............ 438/104; 438/149

(58) Field of Classification Search ............ 438/104, 438/149
See application file for complete search history.

(56) References Cited

U.S. PATENT DOCUMENTS

| 6,878,962 B1 | 4/2005 | Kawasaki et al. |
| 7,491,575 B2 * | 2/2009 | Wu et al. ............ 438/104 |
| 2002/0056838 A1 * | 5/2002 | Ogawa ............ 257/59 |
| 2004/0127038 A1 | 7/2004 | Carcia et al. |
| 2004/0201022 A1 | 10/2004 | Yamazaki et al. |
| 2007/0093004 A1 * | 4/2007 | Park et al. ............ 438/149 |

FOREIGN PATENT DOCUMENTS

| EP | 1 209 748 A1 | 5/2002 |
| JP | 2005-150635 A | 6/2005 |
| JP | 2006-005116 A | 1/2006 |

OTHER PUBLICATIONS

European Patent Office Communication dated Mar. 23, 2009 (in English) issued in counterpart European Application No. 07 744 628.4.

(Continued)

*Primary Examiner* — Luan C Thai
(74) *Attorney, Agent, or Firm* — Holtz, Holtz, Goodman & Chick, PC

(57) ABSTRACT

A manufacturing method of a semiconductor device includes forming an oxide semiconductor thin film layer of zinc oxide, wherein at least a portion of the oxide semiconductor thin film layer in an as-deposited state includes lattice planes having a preferred orientation along a direction perpendicular to the substrate and a lattice spacing $d_{002}$ of at least 2.619 Å.

6 Claims, 11 Drawing Sheets

OTHER PUBLICATIONS

International Preliminary Report on Patentability dated Dec. 3, 2008 (in English), issued in counterpart International Application No. PCT/JP2007/061242.

International Search Report dated Aug. 29, 2007 (in English) issued in counterpart International Application No. PCT/JP2007/061242.

Korean Office Action dated Aug. 9, 2010 and English translation thereof, issued in counterpart Korean Application No. 10-2008-7009086.

Sun et al: "Changes of structure and optical energy gap induced by oxygen pressure during the deposition of ZnO films": Physica B. Condensed Matter, Amsterdam, NL, vol. 381, No. 1-2; (May 31, 2006); pp. 109-112; XP005428873; ISSN: 0921-4526.

Hur Tae-Bong et al: "Strain effects in ZnO thin films and nanoparticles"; Journal of Applied Physics, American Institute of Physics, New York, vol. 99, No. 6; (Mar. 27, 2006); pp. 643081-643085; XP012084016; ISSN: 0021-8979.

Mahalingam et al: "Growth and characterization of electrosynthesised ZnO thin films"; Materials Research Bulletin, Elsevier, Kidlington GB, vol. 38, No. 2; (Jan. 25, 2003); pp. 269-277; XP004405329; ISSN: 0025-5408.

Lee et al: "Probing the work function of a gate metal with a top-gate ZnO-thin-film transistor with a polymer dielectric"; Applied Physics Letters; 88, 023504; (Jan. 11, 2006).

Y.E.Lee et al, Microstructural evolution and preferred orientation change of radio-frequency-magnetron sputtered ZnO thin films; Journal of Vacuum and Science of Technology Part A, vol. 14, May/Jun. 1996, pp. 1943-1948, 1996 American Vacuum Society.

* cited by examiner

Ar/O₂ Flow Ratio 10/15

MANUFACTURING METHOD OF SEMICONDUCTOR DEVICE INCLUDING ACTIVE LAYER OF ZINC OXIDE WITH CONTROLLED CRYSTAL LATTICE SPACING

CROSS-REFERENCE TO RELATED APPLICATIONS

The present application is a Divisional Application of U.S. application Ser. No. 11/809,858 filed Jun. 1, 2007, now U.S. Pat. No. 7,598,520, which is based upon and claims the benefit of priority from the prior Japanese Patent Applications No. 2006-155188 (filed on Jun. 2, 2006), No. 2006-155189 (filed on Jun. 2, 2006), and No.2007-37176(filed on Feb. 16, 2007), the entire contents of which are incorporated herein by reference.

BACKGROUND OF THE INVENTION

1. Field of Invention

The present invention relates to a manufacturing method of a semiconductor device including an active layer of zinc oxide with a controlled crystal lattice spacing.

2. Description of the Background Art

It has been known for many years that zinc oxide has excellent characteristics as a semiconductor (an active layer). In recent years, active research and development of a semiconductor thin film layer of zinc oxide have been made in order to apply such a semiconductor thin film layer to a semiconductor device which includes a thin film transistor (hereinafter abbreviated as TFT), a light emitting device, a transparent conductive film, or the like.

An oxide TFT including a semiconductor thin film layer of zinc oxide has a greater electron mobility and better TFT performance than an amorphous silicon TFT having a semiconductor thin film layer of amorphous silicon (a-Si:H), which has been mainly used for liquid crystal displays. Another advantage of the oxide TFT is that high electron mobility can be expected because a crystalline thin film is formed even at a temperature as low as a room temperature. These advantages have been encouraging the development of the oxide TFTs.

TFTs using an oxide semiconductor thin film layer, such as a bottom gate TFT and a top gate TFT, have been reported. For example, the bottom gate structure includes, in order: a substrate, a gate electrode, a gate insulator, source/drain electrodes, an oxide semiconductor thin film layer, and a protective insulator. The top gate structure includes, for example, in order: a substrate, a pair of source/drain electrodes, an oxide semiconductor thin film layer, a gate insulator, and a gate electrode.

If an oxide semiconductor thin film layer of zinc oxide is formed on an amorphous material (e.g., glass or plastic as used in a substrate of a display), it is known that physical constants (e.g., orientation and lattice constant) of the zinc oxide vary according to the conditions employed in the film formation. For example, "Microstructural evolution and preferred orientation change of radio-frequency-magnetron sputtered ZnO thin films", Journal of Vacuum and Science of Technology Part. A Vol. 14, p. 1943 (1996) shows that the orientation and lattice constant of a zinc oxide film vary according to the ratio between argon (Ar) and oxygen ($O_2$) used as source gases in a sputtering process to form the zinc oxide film. However, this publication does not disclose how the physical properties (e.g., orientation and lattice constant) of zinc oxide affect the heat resistance of the zinc oxide or the performance of semiconductor devices which include a TFT or the like.

The effect of the orientation and the lattice constant of zinc oxide on the performance of a semiconductor device is described in Japanese Patent Publication No. 2005-150635. Japanese Patent Publication No. 2005-150635 discloses that a thin film transistor exhibits preferable performance when the lattice spacing $d_{002}$ of lattice planes along (002) direction ranges from 2.613 Å to 2.618 Å. In Japanese Patent Publication No. 2005-150635, TFT performance of a bottom gate TFT was measured. As shown in FIG. 16, the bottom gate TFT includes a substrate 51, a gate electrode 52, a gate insulator 53, oxide semiconductor thin film layer 54 of zinc oxide, and a pair of source/drain electrodes 55. These layers are combined in this order.

Japanese Patent Publication No. 2005-150635 defines a preferable range of lattice spacing $d_{002}$ of oxide semiconductor thin film layer 54 as 2.613 Å to 2.618 Å based on X-ray diffraction values, which are mean values throughout oxide semiconductor thin film layer 54. Thus, the preferable range 2.613 Å to 2.618 Å defined by Japanese Patent Publication No. 2005-150635 for the lattice spacing $d_{002}$ is calculated from mean values throughout oxide semiconductor thin film layer 54.

In bottom gate TFTs, a portion of oxide semiconductor thin film layer 54 that forms an interface between gate insulator 53 and oxide semiconductor thin film layer 54, having a thickness of 10 nm or less, functions as a channel region. The channel region has a poorer crystallinity than the other part of oxide semiconductor thin film layer 54 since the channel region is formed at an early stage in formation of oxide semiconductor thin film layer 54.

This means that the channel area formed in oxide semiconductor thin film layer 54 at an early stage of the film formation does not always have a lattice spacing $d_{002}$ that is in the range calculated from the mean value of entire oxide semiconductor thin film layer 54 as disclosed in Japanese Patent Publication No. 2005-150635.

In a practical use of a bottom gate TFT in a liquid crystal display or the like, a protective insulator is formed on the oxide semiconductor thin film layer using a heating process. Since zinc oxide has a poor heat resistance, the heat history during the protective insulator formation results in desorption of zinc or oxygen from the oxide semiconductor thin film layer as well as defects in the oxide semiconductor thin film layer. The defects form a shallow impurity level and reduce the resistance of the oxide semiconductor thin film layer.

In a bottom gate TFT, the defects caused by the formation of the protective insulator form defects in the surface of the oxide semiconductor thin film layer, which is at a back channel side of the bottom gate TFT. As described above, the bottom part of the oxide semiconductor thin film layer functions as a channel in the bottom gate TFT. The defects formed on the back channel side greatly affect the performance of the bottom gate TFT.

In producing the bottom gate TFT disclosed in Japanese Patent Publication No. 2005-150635, only vacuum deposition of source/drain electrodes 55 is performed after oxide semiconductor thin film layer 54 is formed. Thus, oxide semiconductor thin film layer 54 as described in Japanese Patent Publication No. 2005-150635 is not affected by the heat history caused during the formation of a protective insulator. In other words, the effects of heat on zinc oxide are not taken into account in defining the lattice constant range disclosed in Japanese Patent Publication No. 2005-150635. Therefore, it is not clear whether oxide semiconductor thin film layer 54 has a lattice spacing that is within the above-mentioned range during the actual use of the TFT in a liquid crystal display or the like after a protective insulator is formed in the TFT.

SUMMARY OF INVENTION

One object of the present invention is to provide a semiconductor device that includes an oxide semiconductor thin film layer of zinc oxide and that exhibits excellent performance even after being subjected to a heat treatment process during formation of an insulating film or the like.

According to one aspect of a manufacturing method of a semiconductor device according to the present invention, a substrate is provided and an oxide semiconductor thin film layer of zinc oxide is deposited on the substrate. In the as-deposited state, the (002) lattice planes of at least a part of the oxide semiconductor thin film layer have a preferred orientation along a direction perpendicular to the substrate and a lattice spacing $d_{002}$ of at least 2.619 Å.

BRIEF DESCRIPTION OF THE DRAWINGS

Further features and advantages of the present invention will become apparent from the following detailed description, taken in combination with the accompanying drawings.

FIG. 2A is a cross sectional view of the thin film transistor after formation of the pair of source/drain electrodes on the substrate; FIG. 2B is a cross sectional view of the thin film transistor after formation of the oxide semiconductor thin film layer and the first gate insulator; FIG. 2C is a cross sectional view of the thin film transistor after formation of the photoresist; FIG. 2D is a cross sectional view of the thin film transistor after patterning of the oxide semiconductor thin film layer and the first gate insulator; FIG. 2E is a cross sectional view of the thin film transistor after formation of the second gate insulator and the contact holes; and FIG. 2F is a cross sectional view of the thin film transistor after formation of the gate electrode, the contact parts, the external source/drain electrodes, and the display electrode;

FIG. 4A is a cross sectional view of the thin film transistor after formation of the pair of source/drain electrodes and the contact layers on the substrate; FIG. 4B is a cross sectional view of the thin film transistor after formation of the oxide semiconductor thin film layer; FIG. 4C is a cross sectional view of the thin film transistor after formation of the first gate insulator; FIG. 4D is a cross sectional view of the thin film transistor after patterning of the first gate insulator, the oxide semiconductor thin film layer, and the contact layers; and FIG. 4E is a cross sectional view of the thin film transistor after formation of the second gate insulator and the contact holes;

FIG. 6A is a cross sectional view of the thin film transistor after formation of the pair of source/drain electrodes and the oxide semiconductor thin film layer on the substrate; FIG. 6B is a cross sectional view of the thin film transistor after formation of the first gate insulator; FIG. 6C is a cross sectional view of the thin film transistor after patterning of the oxide semiconductor thin film layer and the gate insulator; FIG. 6D is a cross sectional view of the thin film transistor after formation of the second gate insulator; FIG. 6E is a cross sectional view of the thin film transistor after formation of the gate electrode and patterning of the first gate insulator and the second gate insulator; and FIG. 6F is a cross sectional view of the thin film transistor after formation of the interlayer insulator;

FIG. 10A is a cross sectional view of the thin film transistor after formation of the gate electrode and the gate insulator; FIG. 10B is a cross sectional view of the thin film transistor after formation of the oxide semiconductor thin film layer and the first overcoat insulator; FIG. 10C is a cross sectional view of the thin film transistor after patterning of the oxide semiconductor thin film layer and the first overcoat insulator; FIG. 10D is a cross sectional view of the thin film transistor after formation of the second overcoat insulator and the contact holes; and FIG. 10E is a cross sectional view of the thin film transistor after formation of the pair of source/drain electrodes;

DETAILED DESCRIPTION

Embodiments of a semiconductor device manufactured by a method of the present invention will be described below using a thin film transistor, which is formed on a substrate, as an example of the semiconductor device. The term "semiconductor device" as used herein refers to a structure including a substrate, and specifically to a device in which at least one semiconductor element (e.g., thin film transistor), which does not include a substrate, is formed on a substrate. It should be understood that the semiconductor device according to the present invention is not limited by the embodiments described below. For example, the semiconductor elements are not limited to thin film transistors but may be other semiconductor elements such as diodes or photoelectric conversion elements. The structure of thin film transistors is not limited by the embodiments shown below.

In the following description, orientations of zinc oxide are represented by the Miller indices, such as (002) preferred orientation. The Miller index (002) corresponds to (0002) preferred orientation represented by an index for the hexagonal crystal system.

The term "intrinsic zinc oxide" as used herein refers to zinc oxide that contains substantially no impurities. The term "dope" as used herein refers to a process of introducing ions and includes an ion-implantation process.

First Embodiment

Figure 1:
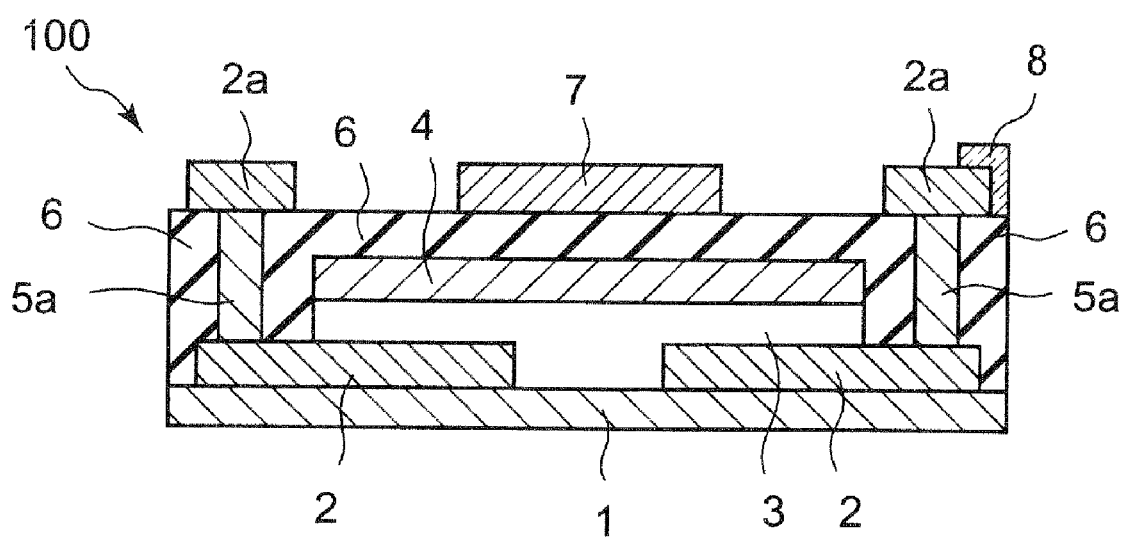
FIG. 1 shows the thin film transistor manufactured by a method of the first embodiment of the present invention.

FIG. 1 shows the structure of a thin film transistor 100 manufactured by a method of the first embodiment of the present invention. Thin film transistor 100, which has a top-gate structure, is supported on substrate 1, and includes: a pair of source/drain electrodes 2, an oxide semiconductor thin film layer 3, a first gate insulator 4, contact parts 5*a*, a pair of external source/drain electrodes 2*a*, a second gate insulator 6, a gate electrode 7, and a display electrode 8.

The pair of source/drain electrodes 2 are formed on substrate 1. Source/drain electrodes 2 are spaced apart from each other on the upper surface of substrate 1.

Oxide semiconductor thin film layer 3 is formed on substrate 1 and the pair of source/drain electrodes 2. Oxide semiconductor thin film layer 3 is arranged such that a channel is formed between a source electrode and a drain electrode of source/drain electrodes 2. Oxide semiconductor thin film layer 3 is formed by an oxide semiconductor mainly comprising zinc oxide.

In FIG. 1, oxide semiconductor thin film layer 3 is shown as having a thinner portion on the pair of source/drain electrodes 2 and a thicker portion between the pair of source/drain electrodes 2, for convenience of illustration. However, the thinner portion and the thicker portion of oxide semiconductor thin film layer 3 actually have a substantially identical thickness. In other words, oxide semiconductor thin film layer 3 has a substantially constant thickness on the pair of source/drain electrodes 2 and between the pair of source/drain electrodes 2. This is also true in other drawings described below.

The (002) lattice planes of the zinc oxide used in oxide semiconductor thin film layer 3 according to the present invention have a preferred orientation along a direction perpendicular to substrate 1 and a lattice spacing $d_{002}$ of at least 2.619 Å. Accordingly, oxide semiconductor thin film layer 3 has a high heat resistance.

The (002) lattice planes of single crystal zinc oxide have a lattice spacing $d_{002}$ that is in a range from 2.602 Å to 2.604 Å. Single crystal zinc oxide therefore exhibits an insufficient heat resistance. If such single crystal zinc oxide having an insufficient heat resistance is used in a top gate thin film transistor having the structure described above, the heat history during formation of gate insulator 4 would cause desorption of zinc and oxygen from the zinc oxide near the surface of oxide semiconductor thin film layer 3 (channel region). The desorption of zinc and oxygen from oxide semiconductor thin film layer 3 causes defects which worsen the film quality of oxide semiconductor thin film layer 3. Such defects form electrically shallow impurity levels and reduce the resistance of oxide semiconductor thin film layer 3. In this situation, thin film transistor 100 operates in a normally-on mode or a depletion mode. Such operation results in increased defect levels, a smaller threshold voltage, and an increased leak current.

The lattice spacing $d_{002}$ of oxide semiconductor thin film layer 3 according to the present invention is at least 2.619 Å.

The oxide semiconductor thin film layer 3 having such a lattice spacing $d_{002}$ exhibits an excellent heat resistance. In other words, it is possible to suppress desorption of oxygen and zinc and to prevent a decrease in the resistance of oxide semiconductor thin film layer 3. Therefore, leak current in thin film transistor 100 is suppressed.

More preferably, the lattice spacing $d_{002}$ of oxide semiconductor thin film layer 3 is at least 2.625 Å. Since such oxide semiconductor thin film layer 3 has an improved heat resistance, leak current in thin film transistor 100 is suppressed. The effect of the lattice spacing and the heat resistance on TFT performance will be described in the EXAMPLES section below.

First gate insulator 4 is formed to coat only the upper surface of oxide semiconductor thin film layer 3. First gate insulator 4 constitutes a part of a gate insulator. First gate insulator 4 functions not only as a gate insulator but also as a protective film that protects oxide semiconductor thin film layer 3 from etching by a resist stripper that is used to remove a photoresist mask employed in etching oxide semiconductor thin film layer 3.

Second gate insulator 6 is formed to coat the entire exposed surfaces of source/drain electrodes 2, oxide semiconductor thin film layer 3, and first gate insulator 4. By forming such second gate insulator 6, the upper surface of semiconductor thin film layer 3 is thoroughly coated with first gate insulator 4 while the side surfaces of semiconductor thin film layer 3 are thoroughly coated with second gate insulator 6.

First gate insulator 4 and second gate insulator 6 may be a silicon oxide ($SiO_x$) film, a silicon oxide nitride (SiON) film, a silicon nitride (SiN) film, or a silicon nitride (SiN) film doped with oxygen using oxygen or a compound containing oxygen. Preferably, first gate insulator 4 and second gate insulator 6 are formed by a silicon nitride (SiN) film doped with oxygen using oxygen or compound (e.g. $N_2O$) containing oxygen. Such a doped silicon nitride film has a higher dielectric constant than silicon oxide compound ($SiO_x$) or silicon oxide nitride (SiON).

First gate insulator 4 and second gate insulator 6 are formed, for example, by means of plasma-enhanced chemical vapor deposition (PCVD).

External source/drain electrodes 2*a* are respectively connected to source/drain electrodes 2 through contact holes 5 via contact parts 5*a*.

Gate electrode 7 is formed on second insulator 6. Gate electrode 7 is configured to control electron density in oxide semiconductor thin film layer 3 according to the gate voltage applied to thin film transistor 100.

Display electrode 8 is configured to apply a voltage to liquid crystal used in a liquid crystal display. Since display electrode 8 is required to have a high transmittance with respect to visible light, display electrode 8 is formed by a conductive oxide thin film containing indium tin oxide (ITO) or the like. It should be understood that the display electrode 8 may be formed by a low resistance zinc oxide thin film of zinc oxide that is doped with dopants such as Al and Ga.

Referring to FIGS. 2A to 2G, a manufacturing method of the thin film transistor 100 according to the first embodiment of the present invention will be described below.

Figure 2A:
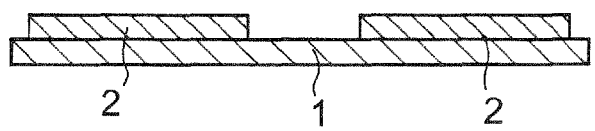
FIGS. 2A to 2F are cross sectional views of the thin film transistor (TFT) sequentially showing a manufacturing method of the thin film transistor of the first embodiment.

Referring to FIG. 2A, a thin metal film is formed on substrate 1, and is then patterned by means of photolithography to form the pair of source/drain electrodes 2.

Figure 2B:
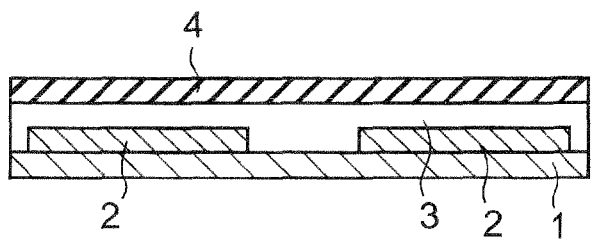

Referring to FIG. 2B, an intrinsic ZnO semiconductor thin film as oxide semiconductor thin film layer 3 is formed by means of magnetron sputtering on all of the exposed surfaces of substrate 1 and the pair of the source/drain electrodes 2 to have a thickness of 50 to 100 nm. First gate insulator 4 is formed on oxide semiconductor thin film layer 3 using a technique and condition(s) that do not reduce the resistance of oxide semiconductor thin film layer 3. It is preferable to form first gate insulator 4 at a temperature of 250° C. or below.

According to one example of the film formation conditions of semiconductor thin film layer 3 of the present embodiment, semiconductor thin film layer 3 may be formed by way of radio-frequency magnetron sputtering using a mixed gas of argon and oxygen as a source gas.

The film formation conditions of oxide semiconductor thin film layer 3 according to the present invention are controlled such that the (002) lattice planes of oxide semiconductor thin film layer 3, in the as-deposited state, have a lattice spacing $d_{002}$ of at least 2.619 Å, while the lattice spacing $d_{002}$ of single crystal zinc oxide is in a range from about 2.602 Å to 2.604 Å.

Specifically, a lower film-formation pressure results in a larger lattice spacing $d_{002}$. In addition, if Ar and $O_2$ are used as source gases in forming a zinc oxide film, a lower $Ar/O_2$ flow ratio (flow ratio of Ar to $O_2$) results in a larger lattice spacing $d_{002}$. Control of the lattice spacing $d_{002}$ will be described in detail in the EXAMPLES section below.

Oxide semiconductor thin film layer 3 experiences a heat history during formation of first gate insulator 4. However, the high heat resistance of oxide semiconductor thin film layer 3 having a lattice spacing of at least 2.619 Å according to the present invention suppresses desorption of oxygen and zinc from oxide semiconductor thin film layer 3 during formation of first gate insulator 4, whereby a decrease in the resistance of oxide semiconductor thin film layer 3 is prevented. Accordingly, leak current in thin film transistor 100 is suppressed.

Figure 2C:
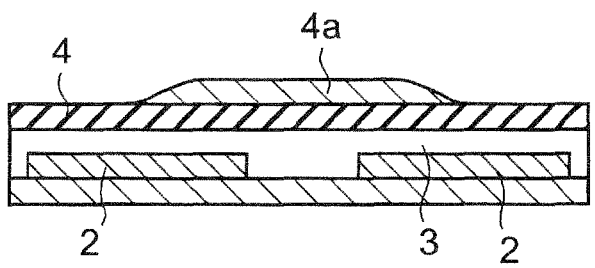

Referring to FIG. 2C, a photoresist is coated and patterned on first gate insulator 4 so as to form a photoresist 4a. Using photoresist 4a as a mask, first gate insulator 4 is dry-etched. Then oxide semiconductor thin film layer 3 is wet-etched.

Figure 2D:
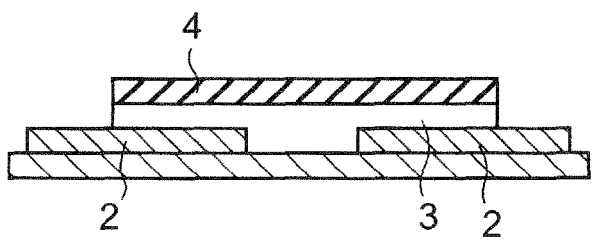

FIG. 2D shows a cross section of thin film transistor 100 after removal of photoresist 4a, subsequent to wet-etching of oxide semiconductor thin film layer 3. In thin film transistor 100, a TFT active layer region including first gate insulator 4 is formed in a self-aligning manner with respect to oxide semiconductor thin film layer 3. First gate insulator 4 is configured not only to form an interface with oxide semiconductor thin film layer 3 but also to protect oxide semiconductor thin film layer 3 during patterning of the active region. Specifically, gate insulator 4 protects oxide semiconductor thin film layer 3 from various agents (e.g., resist stripper) used in a photolithography process. Without first gate insulator 4, the resist stripper, which is used for removal of photoresist 4a after the patterning of the active layer, contacts and roughens the surface and the grain boundaries of oxide semiconductor thin film layer 3. The presence of first gate insulator 4 on oxide semiconductor thin film layer 3 prevents roughening of the surface and the grain boundaries of oxide semiconductor thin film layer 3.

First gate insulator 4 and oxide semiconductor thin film layer 3 may be processed using other methods than the abovementioned methods. For example, both the first gate insulator and the oxide semiconductor thin film layer may be dry-etched or wet-etched.

Figure 2E:
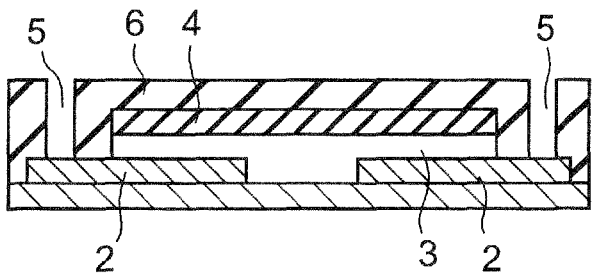

As shown in FIG. 2E, after patterning of the TFT active region, second gate insulator 6 is formed on the entire exposed surfaces of substrate 1, source/drain electrodes 2, oxide semiconductor thin film layer 3, and first gate insulator 4 such that second gate insulator 6 coats first gate insulator 4 and source/drain electrodes 2. Then contact holes 5 are opened in second gate insulator 6 to expose portions of source/drain electrodes 2. It is preferable to form second gate insulator 6 under the same conditions as those employed in forming first gate insulator 4.

Figure 2F:
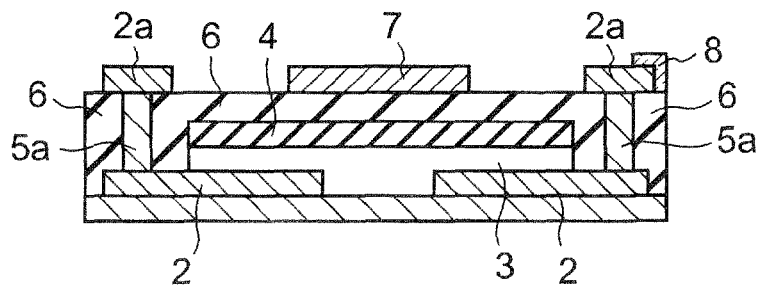

Lastly, referring to FIG. 2F, gate electrode 7 is formed by a metal film on second gate insulator 6. Then external source/drain electrodes 2a are formed by the same material as gate electrode 7. External source/drain electrodes 2a are respectively connected to source/drain electrodes 2 through contact holes 5 via contact parts 5a. Display electrode 8 is formed in the final step to form TFT 100 according to the first embodiment of the present invention.

Although it has been described above that the (002) lattice planes of the entire oxide semiconductor thin film layer 3 have a preferred orientation along a direction perpendicular to substrate 1 and a lattice spacing $d_{002}$ of at least 2.619 Å, the orientation and the lattice spacing of zinc oxide vary depending on the material on which the zinc oxide is formed into a film. In thin film transistor 100, a portion of oxide semiconductor thin film layer 3 that is in contact with substrate 1 (a portion that is positioned between the pair of source/drain electrodes 2) may have a different orientation and a different lattice spacing from the other portion of oxide semiconductor thin film layer 3 that is in contact with the pair of source/drain electrodes 2. In this case, at least the portion that is in contact with substrate 1 should have a lattice spacing $d_{002}$ of at least 2.619 Å and maintain a high resistance. Since a channel is formed above the portion that is in contact with substrate 1, the leak current in thin film transistor 100 is suppressed by maintaining the high resistance of the portion that is in contact with substrate 1.

Second Embodiment

Next, a thin film transistor 200 manufactured by a method of the second embodiment of the present invention will be described. In the following description, parts that are similar to or the same as parts described above with respect to the thin film transistor 100 of the first embodiment will be identified with the same reference numerals as used above with respect to the thin film transistor 100 according to the first embodiment, and description of these parts will be omitted.

Figure 3:
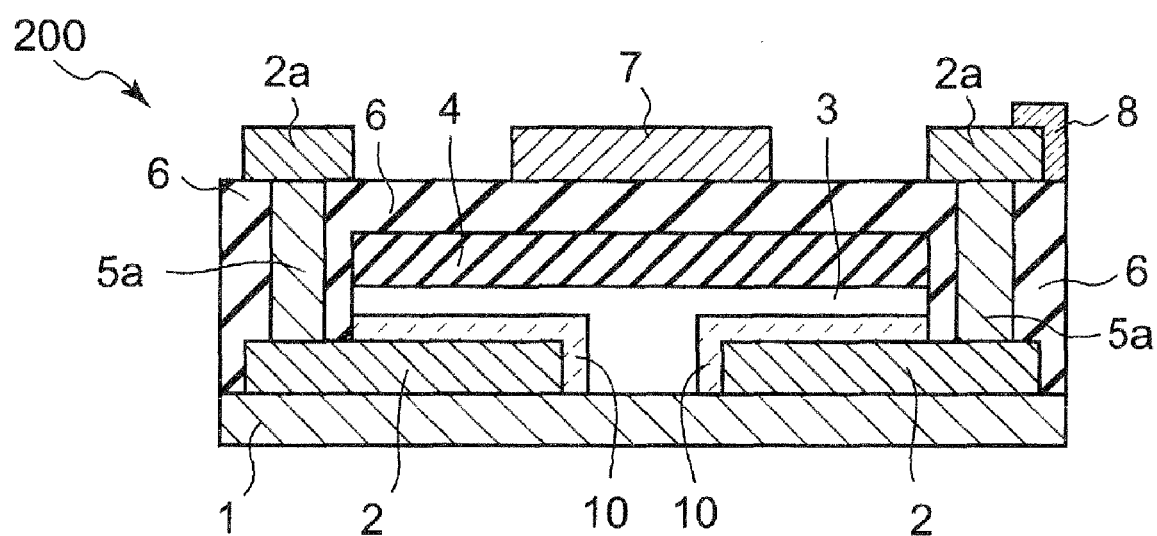
FIG. 3 shows the thin film transistor manufactured by a method of the second embodiment of the present invention.

FIG. 3 shows a thin film transistor 200 manufactured by a method of the second embodiment of the present invention. Thin film transistor 200 is formed on a substrate 1, and includes: a pair of source/drain electrodes 2, a pair of contact layers 10, an oxide semiconductor thin film layer 3, a first gate insulator 4, contact parts 5a, a pair of external source/drain electrodes 2a, a second gate insulator 6, a gate electrode 7, and a display electrode 8. These layers are combined in this order as shown in FIG. 3. As compared to thin film transistor 100, thin film transistor 200 additionally includes a pair of contact layers 10 between the pair of source/drain electrodes 2 and oxide semiconductor thin film layer 3.

The pair of contact layers 10 are mainly formed of zinc oxide and are formed to be in contact with oxide semiconductor thin film layer 3. Specifically, the pair of contact layers 10 are respectively formed on source/drain electrodes 2. Oxide semiconductor thin film layer 3 is formed on contact layers 10 and between contact layers 10 between source/drain electrodes 2 so as to provide a channel between a source electrode and a drain electrode of source/drain electrodes 2. In this way, contact layers 10 are formed between oxide semiconductor thin film layer 3 and the pair of source/drain electrodes 2 to connect oxide semiconductor thin film layer 3 and the pair of source/drain electrodes 2.

In thin film transistor 200, the (002) lattice planes of the zinc oxide used in oxide semiconductor thin film layer 3 and the pair of contact layers 10 have a preferred orientation along a direction perpendicular to substrate 1. Since both oxide semiconductor thin film layer 3 and the pair of contact layers 10 are zinc oxide having (002) planes with a preferred orientation, it is possible to form these layers using an identical target. Therefore, it is possible to form oxide semiconductor thin film layer 3 and contact layers 10 using an identical apparatus. This eliminates the need to provide another apparatus to form the pair of contact layers 10.

The lattice spacing $d_{002}$ of oxide semiconductor thin film layer 3 is at least 2.619 Å. The high heat resistance of oxide semiconductor thin film layer 3 having such a lattice spacing $d_{002}$ reduces effects of the heat treatment during, for example, formation of first gate insulator 4. Therefore it is possible to suppress the occurrence of defects that form shallow impurity levels in oxide semiconductor thin film layer 3 so as to prevent a decrease in the resistance of oxide semiconductor thin film layer 3. Thus, leak current in thin film transistor 200 is suppressed.

The lattice spacing $d_{002}$ of the pair of contact layers 10 is controlled to be smaller than the lattice spacing $d_{002}$ of oxide semiconductor thin film layer 3. Therefore, the heat resistance of the pair of contact layers 10 is lower than the heat resistance of oxide semiconductor thin film layer 3. Accordingly, the heat treatment during, for example, formation of first gate insulator 4 causes more defects in the pair of contact layers 10 than in oxide semiconductor thin film layer 3. The presence of more defects in the pair of contact layers 10 reduces the resistance of the pair of contact layers 10 below the resistance of oxide semiconductor thin film layer 3. This improves the contact between the pair of source/drain electrodes 2 and oxide semiconductor thin film layer 3 as well as the current driving capability of thin film transistor 200.

Specifically, it is preferable that the lattice spacing $d_{002}$ of the pair of contact layers 10 is 2.605 Å or below. Contact layers 10 having a lattice spacing $d_{002}$ of 2.605 Å or below have a sufficiently lower heat resistance than oxide semiconductor thin film layer 3, which as described above has a lattice spacing $d_{002}$ of at least 2.619 Å. Accordingly, after the heat treatment the resistance of the pair of contact layers 10 is lower than the resistance of oxide semiconductor thin film layer 3. This improves the contact between the pair of source/drain electrodes 2 and oxide semiconductor thin film layer 3 as well as the current driving capability of thin film transistor 200.

More preferably, the lattice spacing $d_{002}$ of oxide semiconductor thin film layer 3 is at least 2.625 Å. Oxide semiconductor thin film layer 3 having a lattice spacing $d_{002}$ of at least 2.625 Å has a further improved heat resistance. Therefore, even if oxide semiconductor thin film layer 3 is subjected to a more intensive heat history, the resistance of oxide semiconductor thin film layer 3 is not significantly reduced (see the more detailed discussion in the EXAMPLES section below). Thus, leak current in thin film transistor 200 is suppressed.

If the lattice spacing $d_{002}$ of oxide semiconductor thin film layer 3 is at least 2.625 Å, it is preferable that the lattice spacing $d_{002}$ of contact layers 10 is 2.619 Å or below. In this case, the heat resistance of contact layers 10 is lower than the heat resistance of oxide semiconductor thin film layer 3. Accordingly, after the heat treatment the resistance of the pair of contact layers 10 is lower than the resistance of oxide semiconductor thin film layer 3. This provides better contact between the pair of source/drain electrodes 2 and oxide semiconductor thin film layer 3. Therefore, thin film transistor 200 has a high current driving capability.

If the lattice spacing $d_{002}$ of oxide semiconductor thin film layer 3 is at least 2.625 Å, it is more preferable that the lattice spacing $d_{002}$ of contact layers 10 is 2.605 Å or below. In this case, the heat resistance of the pair of contact layers 10 is further reduced, and therefore the resistance of the pair of contact layers 10 having such a lattice spacing is more significantly reduced by a heat treatment. As a result, better contact between the pair of source/drain electrodes 2 and oxide semiconductor thin film layer 3 is provided.

The effect of the lattice spacing $d_{002}$ of zinc oxide used as a main component of the pair of contact layers 10 and oxide semiconductor thin film layer 3 on the resistance of these layers will be described in detail in the EXAMPLES section below.

Next, the manufacturing method of thin film transistor 200 according to the second embodiment of the present invention will be described with reference to FIGS. 4A to 4E.

Figure 4A:
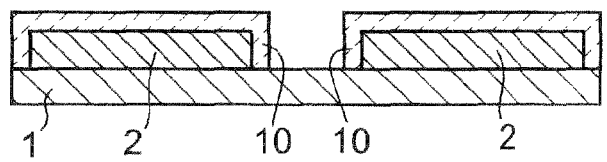
FIGS. 4A to 4E are cross sectional views of the thin film transistor sequentially showing a manufacturing method of the thin film transistor of the second embodiment.

The pair of source/drain electrodes 2 are formed on substrate 1. Then, a contact layer of zinc oxide is formed to have a 10 to 100 nm thickness on all of the exposed surfaces of respective source/drain electrodes 2 and substrate 1. The contact layer of zinc oxide is then patterned so as to form the pair of contact layers 10 on the respective source/drain electrodes 2 with a gap therebetween in the region between the pair of source/drain electrodes 2, as shown in FIG. 4A.

Figure 4B:
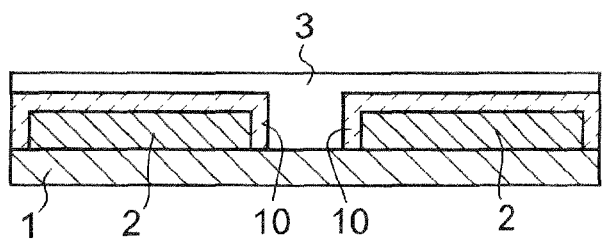

Referring to FIG. 4B, oxide semiconductor thin film layer 3 of zinc oxide is formed on all of the exposed surfaces of substrate 1 and the pair of contact layers 10 to have a thickness of 50 to 100 nm.

The pair of contact layers 10 and the oxide semiconductor thin film layer 3 are formed by means of, for example, magnetron sputtering. The conditions used in these film formations are controlled such that (002) planes of oxide semiconductor thin film layer 3 and the pair of contact layers 10, in the as-deposited state, have a preferred orientation along a direction perpendicular to substrate 1. The film formation conditions are further controlled such that oxide semiconductor thin film layer 3, in the as-deposited state, has a lattice spacing $d_{002}$ of at least 2.619 Å and such that the pair of contact layers 10, in the as-deposited state, have a lattice spacing $d_{002}$ that is smaller than the lattice spacing $d_{002}$ of oxide semiconductor thin film layer 3, in the as-deposited state. (See the disclosure of the preferred relationship between the respective lattice spacings $d_{002}$ of the pair of contact layers 10 and the oxide semiconductor thin film layer 3 above.)

The lattice spacing $d_{002}$ may be controlled by varying the film-formation pressure or the gas flow ratio as mentioned above with respect to the first embodiment.

Specifically, a lower film-formation pressure results in a larger lattice spacing $d_{002}$. Thus, if the oxide semiconductor thin film layer 3 is formed with a film-formation pressure that is lower than the film-formation pressure used when forming the pair of contact layers 10, the oxide semiconductor thin film layer 3 will have a larger lattice spacing $d_{002}$ than the lattice spacing of the pair of contact layers 10. In addition, if Ar and $O_2$ are used as source gases in forming a zinc oxide film, a lower $Ar/O_2$ flow ratio (flow ratio of Ar to $O_2$) results in a larger lattice spacing $d_{002}$. Control of the lattice spacing $d_{002}$ will be described in detail in the EXAMPLES section below.

The oxide semiconductor thin film layer 3 and the pair of contact layers 10 are both of zinc oxide. The lattice spacing $d_{002}$ of oxide semiconductor thin film layer 3 and contact layers 10 is controlled by modifying film formation conditions. In other words, it is possible to form oxide semiconductor thin film layer 3 and the pair of contact layers 10 by using an identical apparatus under different conditions. Therefore, no additional apparatus is needed to form the pair of contact layers 10 when forming thin film transistor 200 having the pair of contact layers 10.

Figure 4C:
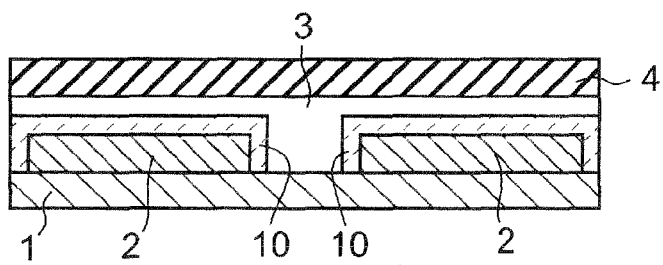

Referring to FIG. 4C, first gate insulator 4 is formed on oxide semiconductor thin film layer 3. During formation of first gate insulator 4, oxide semiconductor thin film layer 3 and contact layers 10 experience a heat history. As described above, the lattice spacing $d_{002}$ of oxide semiconductor thin film layer 3, in the as-deposited state, is larger than the lattice spacing $d_{002}$ of contact layers 10, in the as-deposited state. Therefore, oxide semiconductor thin film layer 3 has a higher heat resistance than contact layers 10. Accordingly, the resistance of the pair of contact layers 10 is reduced by the heat history during the formation of first gate insulator 4, while oxide semiconductor thin film layer 3 maintains a high resistance.

Contact layers 10 have a lower resistance than oxide semiconductor thin film layer 3. Providing contact layers 10 having the lower resistance helps to provide better contact between the pair of source/drain electrodes 2 and oxide semiconductor thin film layer 3.

Further, oxide semiconductor thin film layer 3 maintains a high resistance through the heat history to suppress the leak current in thin film transistor 200.

After formation of first gate insulator 4, a photoresist is formed on first gate insulator 4. Using the photoresist as a mask, first gate insulator 4, oxide semiconductor thin film layer 3, and the pair of contact layers 10 are etched.

Figure 4D:
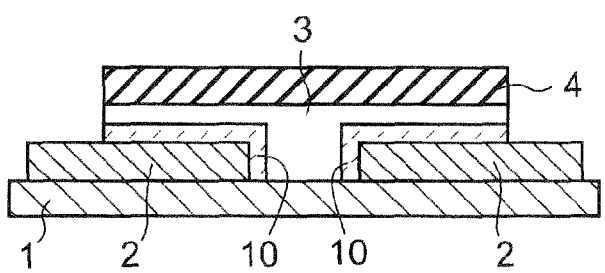

FIG. 4D shows a cross section of thin film transistor 200 after removal of the photoresist subsequent to the etching. Thin film transistor 200 as shown in FIG. 4D has a TFT active layer region that includes first gate insulator 4 formed in a self-aligning manner with respect to semiconductor thin film layer 3. First gate insulator 4 is configured not only to form an interface with oxide semiconductor thin film layer 3 but also to protect oxide semiconductor thin film layer 3 during patterning of the active region. Specifically, gate insulator 4 protects oxide semiconductor thin film layer 3 from various agents (e.g., resist stripper) used in a photolithography process. Without first gate insulator 4, the resist stripper, which is used for removal of photoresist 4a after the patterning of the active layer, contacts and roughens the surface and the grain boundaries of oxide semiconductor thin film layer 3. The presence of first gate insulator 4 on oxide semiconductor thin film layer 3 prevents the surface and the grain boundaries of oxide semiconductor thin film layer 3 from roughening.

Figure 4E:
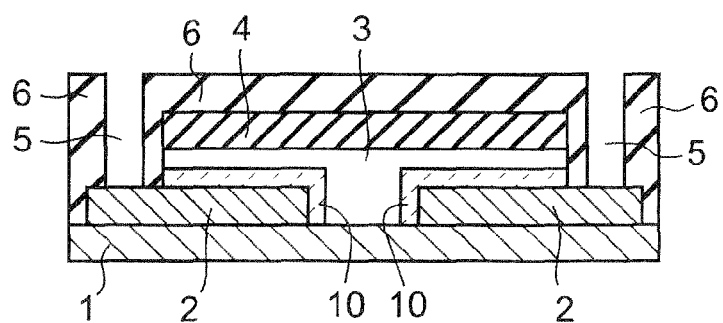

Referring to FIG. 4E, second gate insulator 6 is then formed on all of the exposed surfaces of substrate 1, the pair of source/drain electrodes 2, the pair of contact layers 10, oxide semiconductor thin film layer 3, and first gate insulator 4, such that second gate insulator 6 coats first gate insulator 4 and source/drain electrodes 2. Then contact holes 5 are opened in second gate insulator 6 to expose portions of source/drain electrodes 2. It is preferable to form second gate insulator 6 under the same conditions used to form first gate insulator 4.

Lastly, gate electrode 7 is formed by a metal film on second gate insulator 6. Then external source/drain electrodes 2a are formed by the same material as gate electrode 7. External source/drain electrodes 2a are respectively connected to source/drain electrodes 2 through contact holes 5 via contact parts 5a. Display electrode 8 is formed (see FIG. 3) in the final step to form a TFT 200 according to second embodiment of the present invention.

In a similar manner to the first embodiment described above, the orientation and the lattice spacing of the oxide semiconductor thin film layer 3 and contact layers 10 of TFT 200 vary depending on the underlying layer. The (002) planes of at least a portion of oxide semiconductor thin film layer 3 that is in contact with substrate 1 (a portion that is positioned between the pair of source/drain electrodes 2) and at least a portion of contact layers 10 that is in contact with substrate 1 (a portion that is positioned between the pair of source/drain electrodes 2) should have a preferred orientation along a direction perpendicular to substrate 1 and a lattice spacing $d_{002}$ of at least 2.619 Å in order to maintain a high resistance in an area in which a channel is formed. This further provides better contact between the pair of source/drain electrodes 2 and oxide semiconductor thin film layer 3.

Although the thin film transistor 200 of the second embodiment has been described as being a top gate thin film transistor, the thin film transistor 200 having contact layers 10 according to the second embodiment of the present invention may be a top gate thin film transistor of a different structure or a bottom gate thin film transistor.

Third to Sixth Embodiments

Next, the thin film transistors manufactured by the methods according to the third to sixth embodiments of the present invention will be described.

Oxide semiconductor thin film layer 3 of the thin film transistors according to the third to sixth embodiments includes a first region of intrinsic zinc oxide and second regions doped with donor ions. The first region is a channel region of the oxide semiconductor thin film layer 3 and the second regions are included in a pair of source/drain regions that define the channel region therebetween. The term "intrinsic zinc oxide" as used herein refers to zinc oxide that contains substantially no impurities. The term "dope" as used herein refers to a process of introducing ions and includes an ion-implantation process.

Third Embodiment

Figure 5:
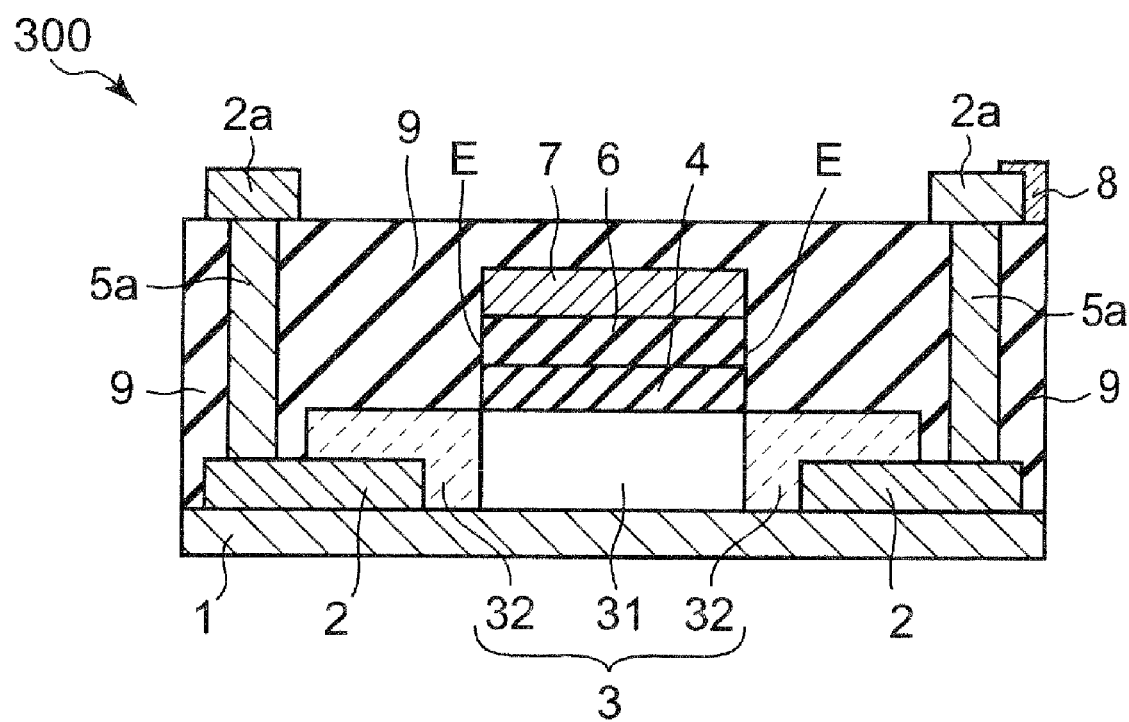
FIG. 5 shows the thin film transistor manufactured by a method of the third embodiment of the present invention.

FIG. 5 shows a thin film transistor 300 manufactured by a method of the third embodiment of the present invention. Thin film transistor 300 is a so-called staggered thin film transistor, which is supported on a substrate 1, and includes: a pair of source/drain electrodes 2 formed on substrate 1 and spaced apart from each other, oxide semiconductor thin film layer 3, a first gate insulator 4, a second gate insulator 6, a gate electrode 7, an interlayer insulator 9, contact parts 5a, a pair of external source/drain electrodes 2a, and a display electrode 8. First gate insulator 4 and second gate insulator 6 are indicated by different numerals because they are formed by separate steps in a manufacturing process of thin film transistor 300.

Oxide semiconductor thin film layer 3 of zinc oxide is arranged to form a channel between a source electrode and a drain electrode of the pair of source/drain electrodes 2.

The (002) planes of the zinc oxide used in oxide semiconductor thin film layer 3 have a preferred orientation and a lattice spacing $d_{002}$ of at least 2.619 Å. Accordingly, oxide semiconductor thin film layer 3 has a high heat resistance.

The high heat resistance of oxide semiconductor thin film layer 3 suppresses desorption of oxygen and zinc and also prevents a decrease in the resistance of oxide semiconductor thin film layer 3. Therefore, leak current in thin film transistor 300 is suppressed.

More preferably, the lattice spacing $d_{002}$ of oxide semiconductor thin film layer 3 is at least 2.625 Å. Since semiconductor thin film layer 3 having such a lattice spacing $d_{002}$ has a further improved heat resistance, leak current in thin film transistor 300 is further suppressed.

Oxide semiconductor thin film layer 3 has a channel region 31 (the first region) and a pair of source/drain regions 32 (regions including the second regions). Channel region 31 is located directly below gate electrode 7 (as shown in FIG. 5) and functions as a channel.

The pair of source/drain regions 32 are the regions of oxide semiconductor thin film layer 3 other than channel region 31. Source/drain regions 32 include the second regions, which are doped with donor ions and exhibit a low resistance. In the thin film transistor 300 according to the third embodiment, the entire areas of source/drain regions 32 are the second regions having a decreased resistance.

By providing source/drain regions 32, it is possible to suppress a parasitic resistance from the pair of source/drain electrodes 2 to the channel as well as current rate degradation. After being ion-doped, the pair of source/drain regions 32 are subjected to an activation treatment in order to reduce the resistance of the pair of source/drain regions 32. The method of reducing the resistance of the pair of source/drain regions 32 will be described in detail later.

First gate insulator 4 is formed to coat only the upper surface of channel region 31 of oxide semiconductor thin film layer 3 whereas second gate insulator 6 is formed to coat only the upper surface of first gate insulator 4. First gate insulator 4 and second gate insulator 6 may be a silicon oxide (SiOx) film, a silicon oxide nitride (SiON) film, a silicon nitride ($SiN_x$) film, or a silicon nitride ($SiN_x$) film doped with oxygen using oxygen or a compound containing oxygen. Also, first gate insulator 4 and second gate insulator 6 may be an aluminum oxide ($AlO_x$) film.

Gate electrode 7 is formed on second gate insulator 6. Preferably, each end of gate electrode 7 is coincident with one of the inner ends of the pair of source/drain regions 32 along the film thickness direction. This reduces a parasitic capacitance between source/drain regions 32 and gate electrode 7 so as to improve the circuit speed of thin film transistor 300. Preferably, gate electrode 7 is narrower than the spacing between the inner ends of the pair of source/drain electrodes 2. This reduces a parasitic capacitance between source/drain regions 32 and gate electrode 7 so as to suppress a decrease in the circuit speed of thin film transistor 300.

Interlayer insulator 9 is formed to coat all of the exposed surfaces of the pair of source/drain electrodes 2, the pair of source/drain regions 32, and gate electrode 7. Interlayer insulator 9 is configured not only to protect thin film transistor 300 but also to heat the pair of source/drain regions 32. This reduces the resistance of the pair of source/drain regions 32.

External source/drain electrodes 2a are respectively connected to source/drain electrodes 2 through contact holes 5 via contact parts 5a.

Display electrode 8 is configured to apply a voltage to liquid crystal used in a liquid crystal display.

Referring to FIG. 6, a manufacturing method of thin film transistor 300 according to the third embodiment will be described.

Figure 6A:
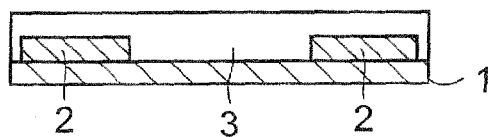
FIGS. 6A to 6F are cross sectional views of the thin film transistor (TFT) sequentially showing a manufacturing method of the thin film transistor of the third embodiment.

As shown in FIG. 6A, a semiconductor thin film of zinc oxide is formed on all of the exposed surfaces of substrate 1 and the pair of source/drain electrodes 2 to have a thickness of, for example, 50 to 100 nm.

According to one example of the film formation conditions of semiconductor thin film layer 3 of the third embodiment, semiconductor thin film layer 3 may be formed by way of radio-frequency magnetron sputtering using a mixed gas of argon and oxygen as a source gas.

The film formation conditions of oxide semiconductor thin film layer 3 according to the present invention are controlled such that the lattice spacing $d_{002}$ of oxide semiconductor thin film layer 3, in the as-deposited state, is at least 2.619 Å. Specifically, the lattice spacing $d_{002}$ may be increased by reducing a film-formation pressure or $Ar/O_2$ flow ratio.

Figure 6D:
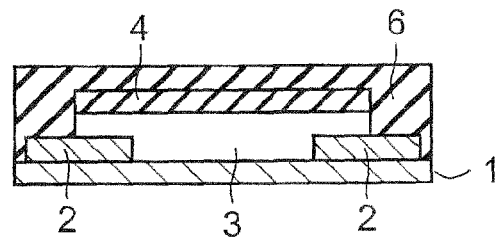
Figure 6B:
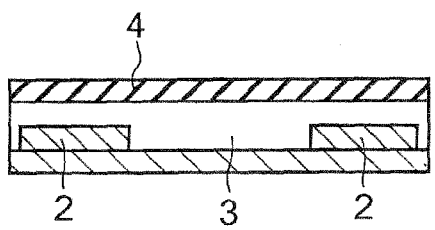

Next, as shown in FIG. 6B, first gate insulator 4 is formed on oxide semiconductor thin film layer 3. During formation of first gate insulator 4, oxide semiconductor thin film layer 3 experiences a heat history. Oxide semiconductor thin film layer 3 according to this embodiment has a lattice spacing $d_{002}$ of at least 2.619 Å and exhibits a high heat resistance. The high heat resistance of oxide semiconductor thin film layer 3 prevents the heat history during the formation of first gate insulator 4 from causing desorption of oxygen and zinc from oxide semiconductor thin film layer 3, so as to suppress leak current in thin film transistor 300. Specifically, the high heat resistance of oxide semiconductor thin film layer 3 reduces limitations on the temperature and the time for treating first gate insulator 4. For example, even if thin film transistor 300 is formed at a comparatively high temperature, thin film transistor 300 becomes excellent in suppression of leak current.

Preferably, the film formation temperature of first gate insulator film 4 is 250° C. or below. The film formation temperature may be determined according to the lattice spacing $d_{002}$ and other conditions of oxide semiconductor thin film layer 3 as well as the desired TFT properties in order to prevent a decrease in the resistance of oxide semiconductor thin film layer 3.

Oxide semiconductor thin film layer 3 and first gate insulator 4 are patterned collectively. The collective patterning of oxide semiconductor thin film layer 3 and first gate insulator 4 makes it possible to protect the surface of oxide semiconductor thin film 3 from a resist stripper or the like. The resist stripper is used in, for example, removing a resist for patterning. FIG. 6C shows thin film transistor 300 after the patterning of oxide semiconductor thin film layer 3 and first gate insulator 4.

As shown in FIG. 6D, after the patterning of oxide semiconductor thin film layer 3 and first gate insulator 4, second gate insulator 6 is formed.

Gate electrode 7 is then formed on second gate insulator 6. Using gate electrode 7 as a mask, first gate insulator 4 and second gate insulator 6 are dry-etched using gas such as $SF_6$.

Figure 6E:
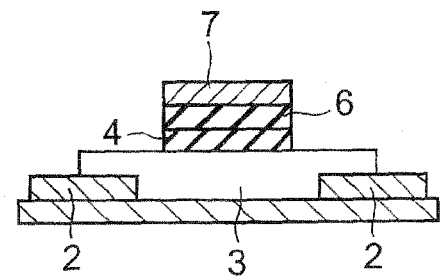
Figure 6C:
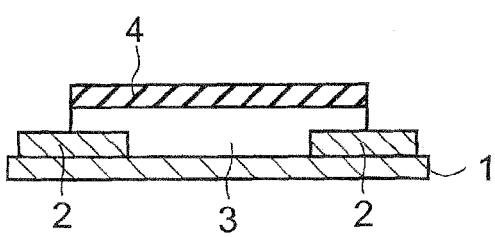

FIG. 6E shows a cross section of thin film transistor 300 after dry-etching of first gate insulator 4 and second gate insulator 6. As shown in FIG. 6E, first gate insulator 4, second gate insulator 6, and gate electrode 7 are formed in a self-aligning manner. Since oxide semiconductor thin film layer 3 is not etched in the dry-etching, each end of oxide semiconductor thin film layer 3 is not coated by first gate insulator 4, such that the ends of the oxide semiconductor thin film layer 3 are in an uncovered state.

After the patterning of first gate insulator 4 and second gate insulator 6, source/drain regions 32 are doped with ions that function as donors for zinc oxide through the full thickness of semiconductor thin film layer 3. Source/drain regions 32 are unmasked regions that are adjacent to the channel region 31 masked with gate electrode 7.

The donor ions include, for example, ions obtained by ionizing group III elements. The group III elements may be at least one of indium, gallium, aluminum, and the like.

Figure 6F:
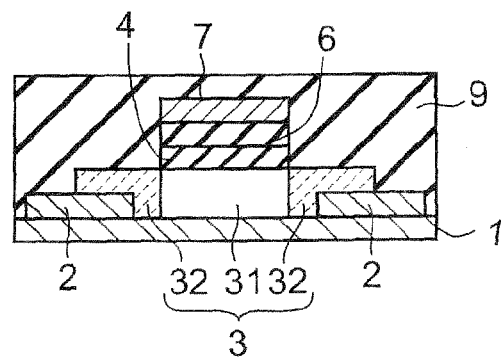

Preferably, the ion-implantation technique is used in the doping. In the ion-implantation technique, accelerated ions with energies of several keV to several MeV are irradiated and doped to a target object. Using the ion-implantation technique, it is possible to dope source/drain regions 32 with the ions after oxide semiconductor thin film layer 3 is formed. In addition, the ion-doping results in interfaces between the doped region and the undoped region being coincident with the edges of first gate insulator 4, respectively as shown in FIG. 6F.

The donor ions may be, for example, ions obtained by ionizing at least one of hydrogen (H), helium (He), neon (Ne), argon (Ar), krypton (Kr), fluorine (F), xenon (Xe), and oxygen (O). Since it is easy to obtain these ions by way of plasma decomposition or the like, mass segregation is not required to dope the ions to a large area.

The pair of source/drain regions 32 according to this embodiment are in an uncovered state. The ions are doped directly to the pair of source/drain regions 32 and not through first gate insulator 4 or second gate insulator 6. This reduces an acceleration voltage used in the doping so as to reduce damages caused by the ion-doping to other regions than the pair of source/drain regions 32.

Now the mechanism of the decrease in resistance of the pair of source/drain regions 32 will be explained.

The decrease in the resistance of the pair of source/drain electrodes 32 is caused by replacing oxygen and zinc (i.e., components of zinc oxide) with the doped ions, which are caused to enter lattice locations of zinc oxide. The entry of the doped ions to lattice locations of zinc oxide is referred to as activation of ions, and is caused by an activation treatment. If oxide semiconductor thin film layer 3 has a lattice spacing $d_{002}$ of 2.602 Å to 2.604 Å, which is similar to the lattice spacing of so-called single crystal zinc oxide, the activation of the ions doped in oxide semiconductor thin film layer 3 is easily caused by an activation treatment such as a heat treatment at a relatively low temperature. However, in zinc oxide with a larger lattice spacing $d_{002}$ (as in the structure of the present invention), the doped ions are less likely to enter lattice locations of the zinc oxide. In other words, ion activation is less likely to occur. In this case, the pair of source/drain regions 32 of oxide semiconductor thin film layer 3 are subjected to a heat treatment (activation treatment) at a higher temperature to cause the activation of the ions doped in these regions. In other words, a heat treatment at a higher temperature allows the doped ions occupying interstitial sites to enter lattice sites to be electrically activated. Therefore, it is possible to selectively reduce the resistance of the pair of source/drain regions 32 so as to suppress a parasitic resistance from the pair of source/drain electrodes 2 to the channel as well as current rate degradation.

The required temperature in the heat treatment applied to the pair of source/drain regions 32 to activate the ions depends on the lattice spacing $d_{002}$ of oxide semiconductor thin film layer 3 (the lattice spacing $d_{002}$ of the pair of source/drain regions 32) and the doping amount of the ions. If the lattice spacing $d_{002}$ of oxide semiconductor thin film layer 3 is at least 2.625 Å, the temperature of the heat treatment is preferably at least 250° C., and more preferably, at least 300° C. A heat treatment at such temperatures securely reduces the resistance of source/drain regions 32. The heat treatment as an activation treatment of the pair of source/drain regions 32 adds a heat history also to channel region 31. However, channel region 31 has a lattice spacing $d_{002}$ of at least 2.619 Å (in this example, at least 2.625 Å) and exhibits a high heat resistance. Therefore, channel region 31 maintains a high resistance through the heat history.

Although the activation treatment has been explained using heat treatment as an example, the activation treatment may be laser irradiation or the like. If a laser irradiation is performed as the activation treatment, only the pair of source/drain regions 32 are irradiated with a laser beam and the pair of source/drain regions 32 are thus selectively activated. The laser used in the laser irradiation may be, for example, ultraviolet, infrared, visible light, and the like. Particularly, ultraviolet light with at least 3.3 eV energy is effectively used because it exhibits a high absorption rate to zinc oxide. Since the pair of source/drain regions 32 are in an uncovered state, it is possible for a laser to directly irradiate the pair of source/drain regions 32. Thus it is easy to activate the pair of source/drain regions 32.

In thin film transistor 300 according to the third embodiment of the present invention, first gate insulator 4 and second gate insulator 6 are temporarily formed on the pair of source/drain regions 32 before the ion-doping to the pair of source/drain regions 32 (see FIGS. 6B to 6D). The resistance of the pair of source/drain regions 32 that have experienced such processes is easily reduced by the ion-doping. This is because the heat history during the formation of first gate insulator 4 and second gate insulator 6 makes the pair of source/drain regions 32 more likely to be activated.

An insulator may be formed on the pair of source/drain regions 32, which are in an uncovered state according to the third embodiment. In this case, the heat history during the formation of the insulator activates the pair of source/drain regions 32 and reduces their resistance.

Specifically, as shown in FIG. 6F, formation of interlayer insulator 9 adds a heat history to the pair of source/drain regions 32. If the resistance of the pair of source/drain regions 32 is sufficiently reduced in the formation of interlayer insulator 9, the above-described activation treatment may not be required, so as to simplify the manufacturing process.

A reduction process may be performed as the activation treatment of the pair of source/drain regions 32. Specifically, interlayer insulator 9 is formed by means of plasma CVD to subject the pair of source/drain regions 32 to a reduction atmosphere of hydrogen or the like. In this treatment, only the pair of source/drain regions 32 are subjected to the reduction atmosphere without subjecting channel region 31 to the reduction atmosphere. This is possible because first gate insulator 4, second gate insulator 6, and gate electrode 7 overlie channel region 31. Therefore, it is possible to selectively reduce the resistance of only the pair of source/drain regions 32.

Then contact holes are opened by means of photolithography in interlayer insulator 9 to expose portions of the pair of the source/drain electrodes 2. External source/drain electrodes 2a are respectively connected to source/drain electrodes 2 through contact holes 5 via contact parts 5a. In the final step to form the TFT 300, display electrode 8 is formed using, for example, indium tin oxide (ITO).

Although thin film transistor 300 as described above includes first gate insulator 4 and second gate insulator 6, thin film transistor 300 may have a single-layered gate insulator to protect the surface of oxide semiconductor thin film layer 3 from etching. In this case, oxide semiconductor thin film layer 3 is patterned before formation of the gate insulator. Then gate electrode 7 is placed on the gate insulator to use the gate electrode 7 as a mask in etching the gate insulator.

Similarly to thin film transistors 100 and 200, it is required in thin film transistor 300 that (002) planes of at least a portion of oxide semiconductor thin film layer 3 that is in contact with substrate 1 (a portion that is positioned between the pair of source/drain electrodes 2) have a preferred orientation along a direction perpendicular to substrate 1 and a lattice spacing $d_{002}$ of at least 2.619 Å. However, it is not necessary for entire oxide semiconductor thin film layer 3 to have these properties. Although thin film transistor 300 as described above is a top gate thin film transistor where gate electrode 7 is positioned above oxide semiconductor thin film layer 3, it may be a bottom gate thin film transistors where gate electrode 7 is positioned below oxide semiconductor thin film layer 3.

Fourth Embodiment

Figure 7:
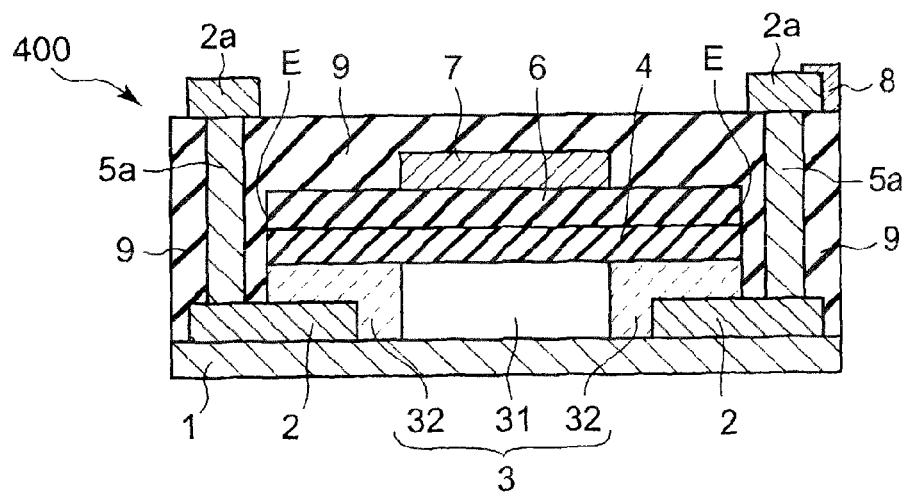
FIG. 7 shows the thin film transistor manufactured by a method of the fourth embodiment of the present invention.

FIG. 7 shows a thin film transistor 400 manufactured by a method of the fourth embodiment. According to the fourth embodiment, thin film transistor 400 has gate insulators 4 and 6 which are configured to coat the entire upper surface of oxide semiconductor thin film layer 3. Thus, in contrast to the structure of the third embodiment, in thin film transistor 400 according to the fourth embodiment, etching surfaces E defining all of the ends of gate insulators 4 and 6 are not coincident with the ends of gate electrode 7 along a film thickness direction.

If etching surfaces E defining every end of gate insulator 4 and 6 are coincident with corresponding ends of gate electrode 7, as in thin film transistor 300 according to the third embodiment, an electric current flows near rough surfaces E, resulting from the etching. This causes a problem of an increased leak current. With the structure of thin film transistor 400 according to the fourth embodiment, by contrast, etching surfaces E of gate insulator 4 and 6 are not coincident with the ends of gate electrode 7 along the film thickness direction such that no electric current flows through etching surfaces E. Therefore it is possible to prevent an increase in leak current due to the roughness of etching surfaces E.

The pair of source/drain regions 32 of thin film transistor 400 are not in an uncovered state during ion-doping of the pair of source/drain regions 32. In addition, surfaces of the pair of source/drain regions 32 are protected by first gate insulator 4 and second gate insulator 6 during formation of interlayer insulator 9. Although etching surfaces E of first and second gate insulator 4 and 6 are formed in a self-aligning manner in the present embodiment with respect to the etching surfaces E of source/drain regions 32, the etching surfaces E may have a different shape. For example, etching surfaces E of gate insulator 6 and gate electrode 7 and etching surfaces of gate insulator 4 and source/drain regions 32 may be formed in a self-aligning manner to obtain a similar effect as well as to reduce acceleration voltage during ion implantation.

Similarly to thin film transistors 100, 200 and 300, it is required in thin film transistor 400 that (002) planes of at least a portion of oxide semiconductor thin film layer 3 that is in contact with substrate 1 (a portion that is positioned between the pair of source/drain electrodes 2) have a preferred orientation along a direction perpendicular to substrate 1 and a lattice spacing $d_{002}$ of at least 2.619 Å. However, it is not necessary for entire oxide semiconductor thin film layer 3 to have these properties.

Although thin film transistor 400 as described above is a top gate thin film transistor where gate electrode 7 is positioned above oxide semiconductor thin film layer 3, it may be a bottom gate thin film transistors where gate electrode 7 is positioned below oxide semiconductor thin film layer 3.

Fifth Embodiment

In the staggered TFTs according to the above-described third and fourth embodiments, the full thickness of the pair of source/drain regions 32 must be doped with ions. However, sometimes it is impossible to dope the full thickness of the source/drain regions 32. For example, it is impossible to dope ions through the full thickness of a film using hydrogen (H), helium (He), neon (Ne), argon (Ar), krypton (Kr), fluorine (F), xenon (Xe), oxygen (O), or the like, even if the ion implantation technique is applied, although the ion implantation technique generally dopes ions to a deeper area of the film than other techniques. In addition, if the film has an excessive thickness, it is impossible to dope ions through the full thickness of a film.

Figure 8:
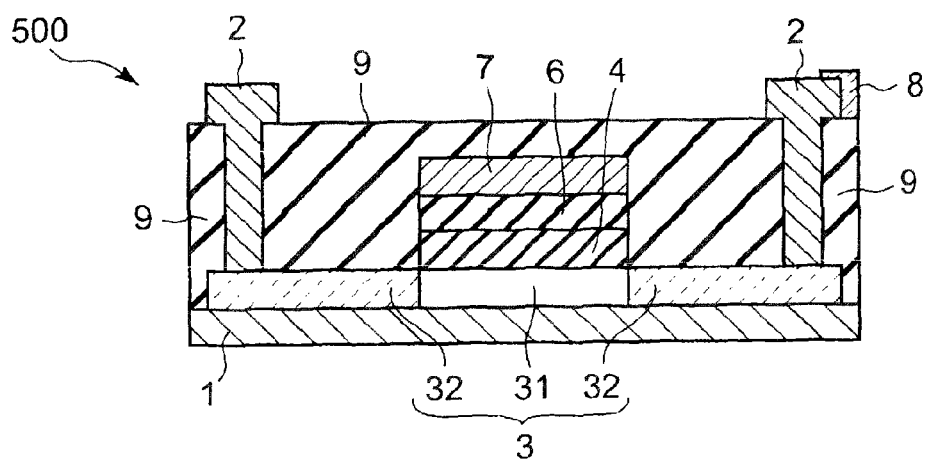
FIG. 8 shows the thin film transistor manufactured by a method of the fifth embodiment of the present invention.

In this case, a coplanar thin film transistor 500 as shown in FIG. 8 is used. The characteristic configurations of the staggered thin film transistors may be applied to coplanar thin film transistor 500. In coplanar thin film transistor 500 according to the fifth embodiment of the present invention, a pair of source/drain electrodes 2 are formed respectively on a pair of source/drain regions 32. With this structure, even a low resistance of only an upper surface of the pair of source/drain regions 32 helps to suppress current rate degradation between the pair of source/drain electrodes 2 and a channel region 31.

In a coplanar thin film transistor, the doping of hydrogen (H), helium (He), neon (Ne), argon (Ar), krypton (Kr), fluorine (F), xenon (Xe), oxygen (O), or the like may be performed by ionizing these ions using plasma decomposition and then subjecting the pair of source/drain regions 32 to the plasma.

Although thin film transistor 500 as described above is a top gate thin film transistor where gate electrode 7 is positioned above oxide semiconductor thin film layer 3, it may be a bottom gate thin film transistor where gate electrode 7 is positioned below oxide semiconductor thin film layer 3.

Sixth Embodiment

Figure 9:
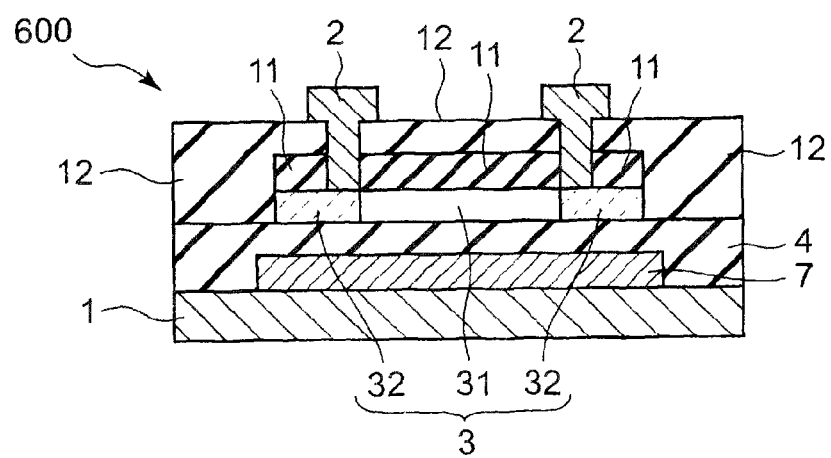
FIG. 9 shows the thin film transistor manufactured by a method of the sixth embodiment of the present invention.

FIG. 9 shows a bottom gate thin film transistor 600 manufactured by a method of the sixth embodiment of the present invention.

Thin film transistor 600 includes a gate electrode 7 formed on a substrate 1, a gate insulator 4 formed after the gate electrode 7 to coat gate electrode 7, an oxide semiconductor thin film layer 3 formed on gate insulator 4, a first overcoat insulator 11 formed to coat an upper surface of oxide semiconductor thin film layer 3, a second overcoat insulator 12 formed to coat side surfaces of oxide semiconductor thin film layer 3 (as well as first overcoat insulator 11), and a pair of source/drain electrodes 2. Gate insulator 4 of the thin film transistor 600 has a single-layered structure. Similarly to thin film transistors 100 to 500, it is required in thin film transistor 600 that (002) planes of the zinc oxide used in oxide semiconductor thin film layer 3 have a preferred orientation along a direction perpendicular to the substrate and a lattice spacing $d_{002}$ of at least 2.619 Å.

In the thin film transistor 600, oxide semiconductor thin film layer 3 is configured to have a connection area connected with the pair of source/drain electrodes 2. A portion of oxide semiconductor thin film layer 3 positioned inside the connection area functions as channel region 31. Outside portions of oxide semiconductor thin film layer 3 function as the pair of source/drain regions 32, which include an area having a lower resistance than channel region 31. More specifically, each of the pair of source/drain regions 32 has a connection area (an area connected with one of the source/drain electrodes 2) that has a resistance that is lower than the resistance of the other areas of the pair of source/drain regions 32. This suppresses a parasitic resistance from the pair of source/drain electrodes 2 to a channel as well as current rate degradation.

Next, a manufacturing method of thin film transistor 600 will be described with reference to FIGS. 10A to 10E.

Figure 10A:
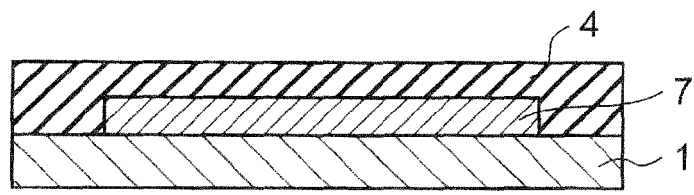
FIGS. 10A to 10E are cross sectional views of the thin film transistor sequentially showing a manufacturing method of the thin film transistor of the sixth embodiment.
Figure 10B:
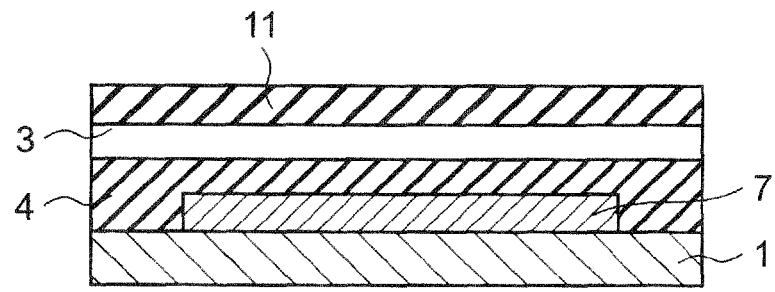

As shown in FIG. 10A, gate electrode 7 and gate insulator 4 are formed on substrate 1. As shown in FIG. 10B, oxide semiconductor thin film layer 3 and first overcoat insulator 11 are then sequentially formed on gate insulator 4.

Figure 10C:
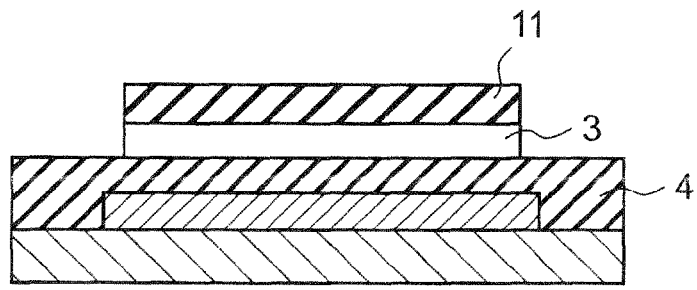

After formation of first overcoat insulator 11, oxide semiconductor thin film layer 3 and first overcoat insulator 11 are etched. FIG. 10C shows a cross section of thin film transistor 600 after the etching. Oxide semiconductor thin film layer 3 and first overcoat insulator 11, as shown in FIG. 10C, are formed in a self-aligning manner. First overcoat insulator 11 is configured to protect oxide semiconductor thin film layer 3 during the etching. Specifically, first overcoat insulator 11 functions as a protective film that protects oxide semiconductor thin film layer 3 from various agents such as a resist stripper used in the etching of oxide semiconductor thin film layer 3. This avoids the surface roughening of semiconductor thin film layer 3.

Figure 10D:
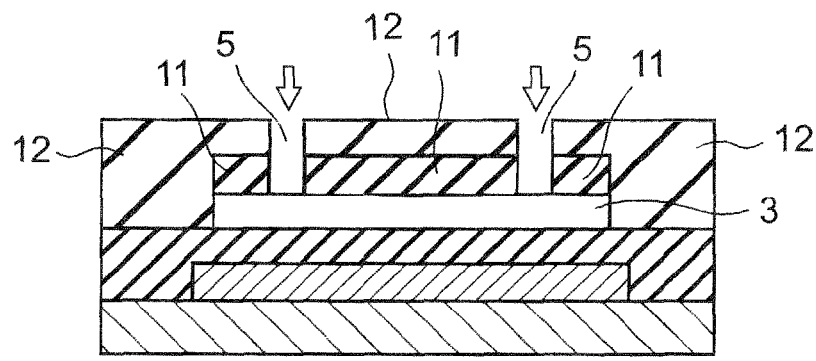

As seen in FIG. 10D, after formation of first overcoat insulator 11, second overcoat insulator 12 is formed. Then contact holes 5 are opened through first and second overcoat insulators 11 and 12 to oxide semiconductor thin film layer 3 by way of photolithography.

Oxide semiconductor thin film layer 3 is subjected to an activation treatment by ion-doping through contact holes 5 (see FIG. 10D) to reduce the resistance of portions of oxide semiconductor thin film layer 3 under contact holes 5.

Since the portions of oxide semiconductor thin film layer 3 under contact holes 5 are in an uncovered state, it is easy to subject these portions to an ion-doping and an activation treatment.

Figure 10E:
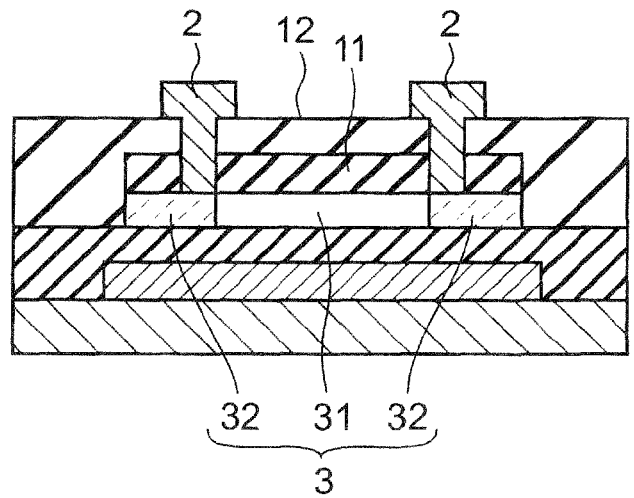

In the final step to form thin film transistor 600, contact holes 5 are filled with metallic materials or the like (see FIG. 10E). The metallic materials in contact holes 5 form the pair of source/drain electrodes 2. As described above, the portion of oxide semiconductor thin film layer 3 positioned inside the connection area (area connected with the pair of source/drain electrodes) functions as channel region 31, while the outside portions of oxide semiconductor thin film layer 3 function as the pair of source/drain regions 32. Since the exposed portions with the reduced resistance are located in the pair of source/drain regions 32 as the second regions, a parasitic resistance between the pair of source/drain electrodes 2 and the channel is suppressed.

It has been described that a treatment for reducing the resistance of oxide semiconductor thin film layer 3 of thin film transistor 600 is performed through contact holes 5, which are formed in second overcoat insulator 12 by means of photolithography (see FIG. 10D). To use such a treatment, at least a part of contact holes 5 and gate electrode 7 should overlap each other in an overlap area. If such an overlap area is not formed, an offset structure, in which an area of a high resistance is formed between the channel and source/drain regions 32, of the thin film transistor 600 results. This may increase parasitic capacitance of thin film transistor 600 and cause current rate degradation.

If the thin film transistor 600 has this structure in which the overlap area of the contact holes 5 with the gate electrode 7 is not present, one solution to prevent the high resistance area between the channel and source/drain regions 32 and to reduce the parasitic capacitance of thin film transistor 600 is patterning a resist on first overcoat insulator 11 without using a photomask to reduce the resistance of oxide semiconductor thin film layer 3. Specifically, after the patterning of first overcoat insulator 11 and oxide semiconductor thin film layer 3 (see FIG. 10C), a resist is formed on first overcoat insulator 11. The resist is exposed to light from a substrate side and patterned. The resist is used as a mask in the ion-doping and activation treatment performed subsequently to reduce the resistance of the pair of source/drain regions 32, which are located outside the area that overlies gate electrode 7.

In this case, gate electrode 7 should be shorter in a channel length direction and longer in a channel width direction than oxide semiconductor thin film layer 3. A portion of semiconductor thin film layer 3 directly above gate electrode 7 functions as channel region 31 whereas the other portions of oxide semiconductor thin film layer 3 defining the channel region 31 therebetween function as the pair of source/drain regions 32.

This method enables the resistance of the entire area of the pair of source/drain regions 32, which are defined as regions in oxide semiconductor thin film layer 3 other than channel region 31, to be reduced.

EXAMPLES

Hereinafter, the effect of the film formation conditions of a zinc oxide thin film on the preferred orientation and the lattice spacing of the zinc oxide film will be explained.

A zinc oxide thin film was formed on a glass substrate by means of radio-frequency magnetron sputtering, using nine film formation conditions resulting from combinations between three film-formation pressures and three $Ar/O_2$ gas flow ratios in a mixed gas of argon and oxygen as a source gas. The three film-formation pressures were 7 Pa, 1 Pa, and 0.5 Pa. The three $Ar/O_2$ gas flow ratios were 10/5, 10/15, and 10/30 ccm (cc/min).

The following conditions are used in this example. Sintered and pressed zinc oxide having a purity of 99.999% was used as a target. The substrate temperature was kept at 150° C. The distance between the substrate and the target was fixed at 88 mm. The diameter of the zinc oxide target was 4 inches φ. The applied electric power was 180 W, i.e., the radio-frequency power density was 2.2 $W/cm^2$.

X-ray diffraction was used to estimate the preferred orientation and the lattice spacing of the zinc oxide films prepared under the above-mentioned nine film formation conditions. CuKα1 (wave length: 1.54056 Å) was used in the X-ray diffraction measurement.

It was confirmed that all of the zinc oxide thin films had an X-ray diffraction peak only in (002) direction. It was also confirmed that the (002) planes of all the zinc oxide thin films had a preferred orientation.

The X-ray enters samples and produces diffraction peaks in an angle that meets the following Bragg's condition, $$2 \times d \times \sin\theta = n \times \lambda,$$

where d is a lattice spacing along the film thickness direction; λ is a wave length of the X-ray used in the measurement; n is a diffraction order; and θ is a diffraction angle (rad) of the X-ray.

For thin films in which (002) planes have a preferred orientation, d corresponds to lattice spacing $d_{002}$ of (002) lattice planes. For CuKα1 ray used in this measurement, λ=1.54056 Å. In this example, n=1.

Therefore, this example meets the following equation.

$$d = (1 \times 1.54056)/(2 \times \sin\theta).$$

This means that lattice spacing d depends on the diffraction angle θ at which the X-ray produces diffraction peaks. The increase in lattice spacing d results in a smaller diffraction angle θ.

Since all of the zinc oxide thin films formed under the nine film formation conditions have a preferred c-axis orientation, d obtained for the zinc oxide thin films of this example is lattice spacing $d_{002}$. Lattice spacing $d_{002}$ is calculated from X-ray diffraction peak locations.

It has been reported that the lattice spacing constant $2d_{002}$ of single-crystal zinc oxide along (002) direction ranges from 5.204 Å to 5.208 Å. Considering that there are two of Zn planes or O planes in a unit lattice, the (002) lattice planes have a lattice spacing $d_{002}$ of single-crystal zinc oxide that is in the range from 2.602 Å to 2.604 Å.

Figure 11:
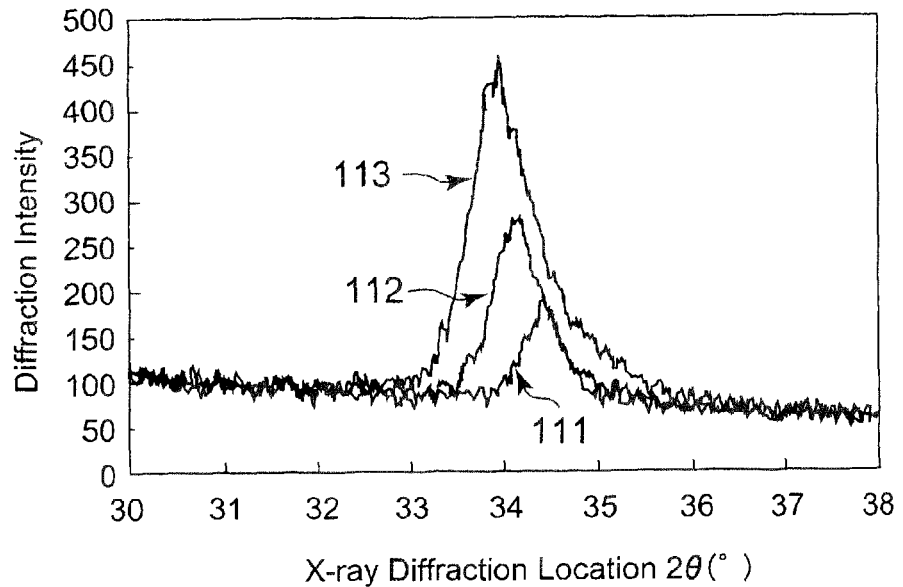
FIG. 11 is a graph showing (002) diffraction peak locations in zinc oxide thin films formed under different film-formation pressures.

FIG. 11 shows a change in (002) diffraction peak locations of the zinc oxide thin films with respect to different film-formation pressures. $Ar/O_2$ flow ratio is fixed to 10/15 ccm.

In FIG. 11, curves 111, 112, and 113 respectively indicate results when the film-formation pressure is 7 Pa, 1 Pa, and 0.5 Pa. The vertical scale plots X-ray diffraction intensity (arb. unit) whereas the horizontal scale plots diffraction peak location $2\theta$.

As shown in FIG. 11, the decrease in film-formation pressure from 7 Pa to 0.5 Pa results in a decreasing shift of X-ray peak location, which indicates increase in lattice spacing $d_{002}$ of (002) lattice planes.

Figure 12:
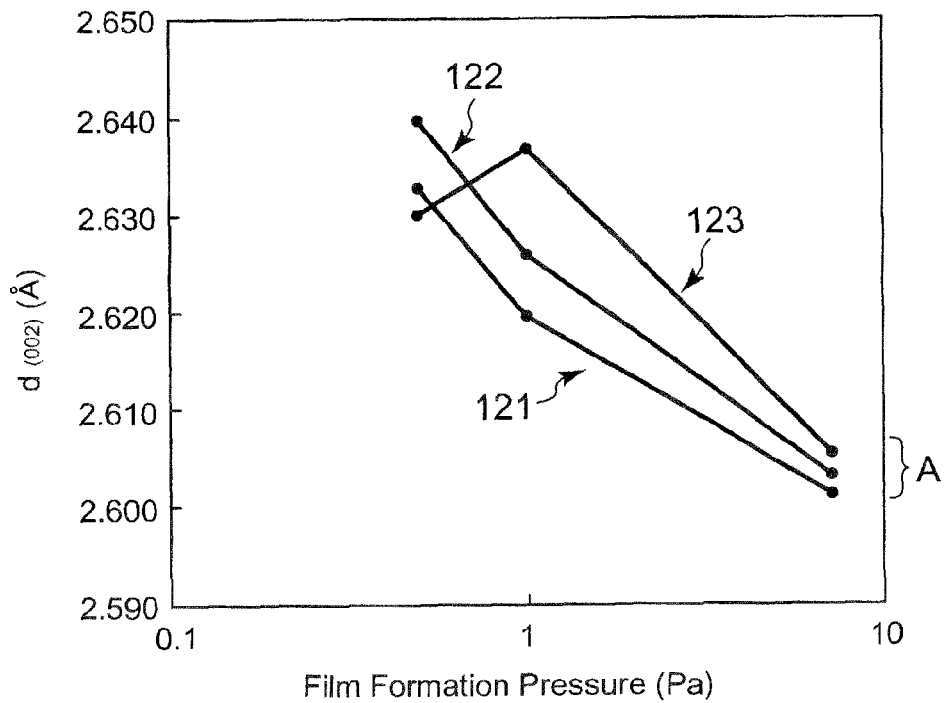
FIG. 12 is a graph showing the dependency of the lattice spacing $d_{002}$, which is calculated from X-ray diffraction results, on the film-formation pressure under different gas flow rates.

FIG. 12 shows the dependency of lattice spacing $d_{002}$ on film-formation pressures according to the X-ray diffraction results obtained for different gas flow ratios.

In FIG. 12, curves 121, 122, and 123 respectively indicate the results when the gas flow ratio $Ar/O_2$ is 10/5, 10/15, and 10/30 ccm. The vertical scale plots lattice spacing $d_{002}$ whereas the horizontal scale plots film-formation pressure during formation of the zinc oxide films.

The lattice spacing of single crystal zinc oxide is distributed within range A shown in FIG. 12.

As shown in FIG. 12, the lower the film-formation pressure is or the $Ar/O_2$ flow ratio is, the larger the lattice spacing $d_{002}$ becomes.

It is noted that it is possible to control the lattice spacing (i.e., lattice constant) of the zinc oxide by changing film formation conditions.

The nine kinds of data plotted in FIG. 11 and FIG. 12 are shown in Table 1 below. The characters A-I respectively indicate the nine zinc oxide thin films.

TABLE 1

| | $Ar/O_2$ | Pressure | $2\theta$ | $d_{002}$ |
|---|---|---|---|---|
| A | 10/5 | 0.5 | 34.02 | 2.63280 |
| B | 10/5 | 1 | 34.20 | 2.61964 |
| C | 10/5 | 7 | 34.45 | 2.60138 |
| D | 10/15 | 0.5 | 33.93 | 2.63955 |
| E | 10/15 | 1 | 34.12 | 2.62583 |
| F | 10/15 | 7 | 34.42 | 2.60327 |
| G | 10/30 | 0.5 | 34.06 | 2.63009 |
| H | 10/30 | 1 | 33.97 | 2.63685 |
| I | 10/30 | 7 | 34.39 | 2.60560 |

Next, the relation between the heat resistance and the lattice spacing of zinc oxide thin films will be described.

Figure 13:
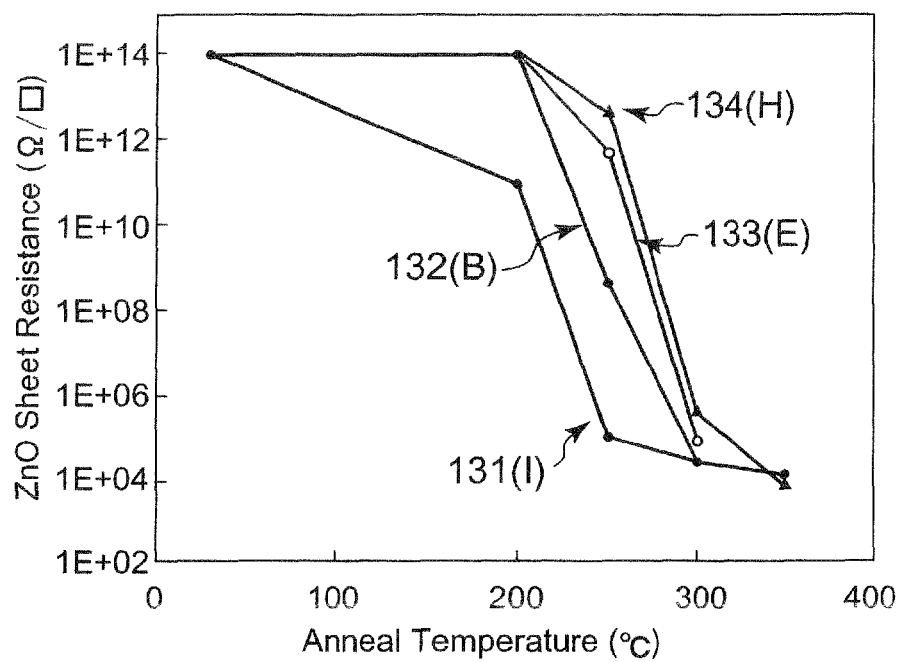
FIG. 13 is a graph showing the dependency of the sheet resistance of zinc oxide thin films on the heat treatment temperatures.

FIG. 13 shows the dependency of the sheet resistance of zinc oxide thin films on heat-treatment temperature.

In FIG. 13, curves 131, 132, 133, and 134 respectively indicate the sheet resistivity of zinc oxide thin films in which the (002) lattice planes have a lattice spacing $d_{002}$ of 2.605 Å (thin film I), 2.619 Å (thin film B), 2.625 Å (thin film E), and 2.636 Å (thin film H). The sheet resistivity was measured after a heat treatment for 2 hours in a vacuum. The vertical scale plots sheet resistivity whereas the horizontal scale plots anneal temperature. Since the sheet resistivity of the zinc oxide films exhibits an identical behavior below 200° C., curves 132, 133, and 134 overlap each other in this range.

For a zinc oxide thin film in which the (002) lattice planes have a lattice spacing $d_{002}$ of 2.605 Å (thin film I, curve 131 in FIG. 13), which is similar to the lattice spacing $d_{002}$ of single crystal zinc oxide, a heat treatment at 200° C. results in a reduction in resistivity by at least 3 orders of magnitude from the high resistance ($10^{14} \Omega/\square$ sheet resistance) of the zinc oxide thin film, in the as-deposited state (immediately after the film formation). A heat treatment at 250° C. applied to the zinc oxide thin film having a lattice spacing $d_{002}$ of 2.605 Å results in a reduction in resistivity by approximately 10 orders of magnitude from the high resistance ($10^{14} \Omega/\square$ sheet resistance) of the zinc oxide thin film in the as-deposited state.

For the zinc oxide thin film in which the (002) lattice planes have a lattice spacing $d_{002}$ of 2.619 Å (thin film B, curve 132 in FIG. 13), a heat treatment at 200° C. does not significantly reduce the resistvity of the zinc oxide thin film from the resistance of the oxide semiconductor thin film in the as-deposited state. A heat treatment at 250° C. applied to the same zinc oxide thin film results in a reduction in the resistivity by approximately 5 orders of magnitude, which is smaller than the reduction by approximately 9 orders of magnitude found when the heat treatment at 250° C. is applied to the zinc oxide thin film having a lattice spacing $d_{002}$ of 2.605 Å.

For the zinc oxide thin film in which (002) lattice planes have a lattice spacing $d_{002}$ of 2.625 Å (thin film E, curve 133 in FIG. 13), a heat treatment at 250° C. results in a reduction in resistivity by approximately 2 orders of magnitude. For the zinc oxide thin film having a lattice spacing $d_{002}$ of 2.636 Å (thin film H, curve 134 in FIG. 13), the same heat treatment results in a still smaller reduction in the resistivity by approximately 1 order of magnitude. (As described above the sheet resistivity of the zinc oxide films E and H exhibits a behavior identical to the behavior of the sheet resistivity of the zinc oxide film B below 200° C.)

Thus, an increase in the lattice spacing $d_{002}$ reduces the temperature at which the decrease in resistivity starts and thereby improves heat resistance.

Considering the above results, an oxide semiconductor thin film layer having a lattice spacing $d_{002}$ of at least 2.619 Å that exhibits a high heat resistance is preferably used as an oxide semiconductor thin film layer having a high heat resistance, in the present invention. More preferably, an oxide semiconductor thin film layer having a lattice spacing $d_{002}$ of at least 2.625 Å is used.

It is found from the above results that the thin film transistor 200 according to the second embodiment of the present invention exhibits an excellent TFT performance. For example, if a zinc oxide thin film having a lattice spacing $d_{002}$ of 2.625 Å is used as oxide semiconductor thin film layer 3 and if a heat treatment at 250° C. is used in formation of first gate insulator 4, a zinc oxide thin film having a lattice spacing $d_{002}$ of 2.619 Å or below is preferably used as contact layers 10 so as to control the resistance of the pair of contact layers 10 to be smaller than the resistance of oxide semiconductor thin film layer 3 by at least 2 orders of magnitude. This difference between the resistance of contact layers 10 and the resistance of oxide semiconductor thin film layer 3 is sufficient to provide a better contact between the pair of source/drain electrodes 2 and oxide semiconductor thin film layer 3. More preferably, a zinc oxide thin film having a lattice spacing $d_{002}$ of 2.605 Å or below is used as contact layers 10 so as to control the resistance of the pair of contact layers 10 to be smaller than the resistance of oxide semiconductor thin film layer 3 by at least 6 orders of magnitude.

Alternatively, if a zinc oxide thin film having a lattice spacing $d_{002}$ of 2.619 Å is used as oxide semiconductor thin film layer 3 and if a heat treatment at 250° C. is used in formation of first gate insulator 4, a zinc oxide thin film having a lattice spacing $d_{002}$ of 2.605 Å or below is preferably used as the pair of contact layers 10 so as to control the resistance of the pair of contact layers 10 to be smaller, by at least 2 orders of magnitude, than the resistance of the oxide semiconductor thin film layer 3.

Next, the TFT performance of a thin film transistor is tested to clarify the effects of the present invention.

Thin film transistor 100 (see FIG. 1) is prepared according to the following method (see FIG. 2).

A substrate 1 of no alkali glass mainly comprising $SiO_2$ and $Al_2O_3$ is provided. A pair of source/drain electrodes 2 of indium tin oxide are formed on the substrate 1 to be 40 nm in thickness.

A zinc oxide thin film is deposited by radio-frequency magnetron sputtering on all of the exposed surfaces of substrate 1 and the pair of source/drain electrodes 2 to form an oxide semiconductor thin film layer 3 of 60 nm thickness.

After formation of oxide semiconductor thin film layer 3, first gate insulator 4 of SiN having a 50 nm thickness is formed on the entire upper surface of oxide semiconductor thin film layer 3. Formation of first gate insulator 4 is performed at 250° C. by means of plasma enhanced chemical vapor deposition (PCVD) using $SiH_4+NH_3+N_2$ gas.

Then a photoresist is coated and patterned on first gate insulator 4. Using the patterned photoresist as a mask, first gate insulator 4 is dry-etched using $CF_4+O_2$ gas.

After the etching of first gate insulator 4, oxide semiconductor thin film layer 3 is wet-etched using 0.2% $HNO_3$ solution to remove the photoresist. Then second gate insulator 6 of $SiN_x$ having a 300 nm thickness is formed on all of the exposed surfaces of substrate 1, source/drain electrodes 2, oxide semiconductor thin film layer 3, and first gate insulator 4.

Formation of second gate insulator 6 is performed at 250° C. by means of plasma enhanced chemical vapor deposition (PCVD) using $SiH_4+NH_3+N_2$ gas.

After formation of second gate insulator 6, contact holes are opened in an upper part of the pair of source/drain electrodes 2.

Lastly, gate electrode 7 of Cr having a 100 nm thickness is formed on second gate insulator 6, and then external source/drain electrodes 2a are formed, using the same material. The external source/drain electrodes 2a are respectively connected to source/drain electrodes 2 through contact holes 5 via contact parts 5a in the final step of forming thin film transistor 100 used in the TFT performance test.

Three sample thin film transistors were prepared by the manufacturing process described above using respective zinc oxide thin films having different lattice spacings. A control thin film transistor, referred to below as thin film transistor 101, was formed using a zinc oxide thin film (thin film I) having a lattice spacing $d_{002}$ of 2.605 Å as oxide semiconductor thin film layer 3. A thin film transistor referred to below as thin film transistor 102 was formed using a zinc oxide thin film (thin film E) having a lattice spacing $d_{002}$ of 2.625 Å as oxide semiconductor thin film layer 3. And a thin film transistor referred to below as thin film transistor 103 was formed using a zinc oxide thin film (thin film G) having a lattice spacing $d_{002}$ of 2.630 Å as oxide semiconductor thin film layer 3.

Thin film transistor 100 and the control thin film transistor have a top gate structure. In the top gate structure, an upper part of oxide semiconductor thin film layer 3 is used as a channel region. The oxide semiconductor thin film layer 3 in a top gate thin film transistor is more directly affected by the heat produced in forming the gate insulator on the oxide semiconductor thin film layer 3 than the oxide semiconductor thin film layer 3 in a bottom gate thin film transistor. Use of the top gate thin film transistor enables results to be obtained that more precisely reflect the effects of the heat applied to the oxide semiconductor thin film layer.

Figure 14:
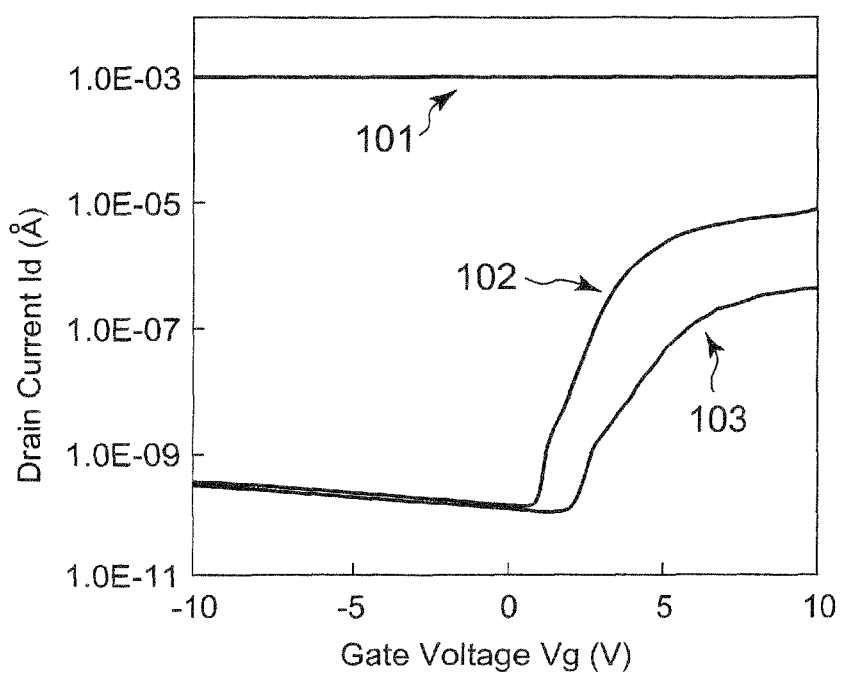
FIG. 14 is a graph showing the drain current versus applied gate voltage.

The TFT performance of each of the thin film transistors 101, 102, and 103 formed by the above-described process were tested as described below. FIG. 14 shows a change in the drain current of thin film transistor 101, 102, and 103 according to various gate voltages applied to thin film transistor 101, 102, and 103. In FIG. 14, the vertical scale plots the magnitude of drain current Id whereas the horizontal scale plots the magnitude of the applied gate voltage Vg. A constant drain voltage Vd is used in this test.

As shown in FIG. 14, thin film transistor 101 including an oxide semiconductor thin film layer having a lattice spacing $d_{002}$ of 2.605 Å allows a constant drain current to remain unaffected by the change in the gate voltage. This means that thin film transistor 101 operates in a so-called normally-on mode or a depletion mode. In other words, thin film transistor 101 does not function as a thin film transistor.

The oxide semiconductor thin film layer of thin film transistor 101 has a similar lattice spacing $d_{002}$ to the lattice spacing $d_{002}$ of single crystal zinc oxide and exhibits an insufficient heat resistance, as shown by curve 131 in FIG. 13. The heat history during formation of gate insulator 4 causes desorption of zinc and oxygen from the channel region located around the surface of oxide semiconductor thin film layer 3. The desorption forms defects in the oxide semiconductor thin film layer, which reduces the resistance of the oxide semiconductor thin film layer. Thus thin film transistor 101 loses its functions as a TFT.

The drain current of TFT 103 having a lattice spacing $d_{002}$ of 2.630 Å rises at a gate voltage of 2V. This means that TFT 103 has sufficient functions as a TFT.

The drain current of TFT 102 having a lattice spacing $d_{002}$ of 2.625 Å exhibits a higher rise characteristic than TFT 103. In addition, the drain current value of TFT 102 at a gate voltage 10V is improved by at least 1 order of magnitude, as compared to TFT 103.

As described above, an increase in the lattice spacing $d_{002}$ results in an increase in the heat resistance. The increased heat resistance suppresses defects in the oxide semiconductor thin film layer to improve the TFT performance. The better TFT performance of TFT 102 than the TFT performance of TFT 103 of a greater lattice spacing $d_{002}$ could be due to the more advanced crystallization in thin film E (lattice spacing $d_{002}$=2.625 Å) of TFT 102 than the crystallization in thin film G (lattice spacing $d_{002}$=2.630 Å) of TFT 103, referring to the comparison between the X-ray diffraction intensities of the curve 113 (thin film D: $d_{002}$=2.639 Å) and the curve 112 (thin film E: $d_{002}$=2.625 Å). Though not shown in the drawings, a test comparing the X-ray diffraction intensities of thin film E and thin film G was carried out and the test revealed a more advanced crystallization in thin film G.

In this example, the TFT performance of top gate thin film transistors has been tested. This is because the top gate thin film transistors are more sensitive to the heat history than bottom gate thin film transistors. However, the heat history during formation of a protective insulator on the oxide semiconductor thin film layer also causes defects in a bottom gate thin film transistor so as to particularly affect the back channel. The effects on the back channel change the TFT performance. Therefore, the high resistance oxide semiconductor thin film layer according to the present invention may also be useful in bottom gate thin film transistors.

The semiconductor element included in the present invention is not limited to a thin film transistor but may be other kinds of semiconductor element. The present invention may be useful not only in a thin film transistor but also in other semiconductor devices. The present invention is particularly useful in a structure where an oxide semiconductor thin film layer is affected by the heat history during formation of an insulator on the oxide semiconductor thin film layer.

Figure 15:
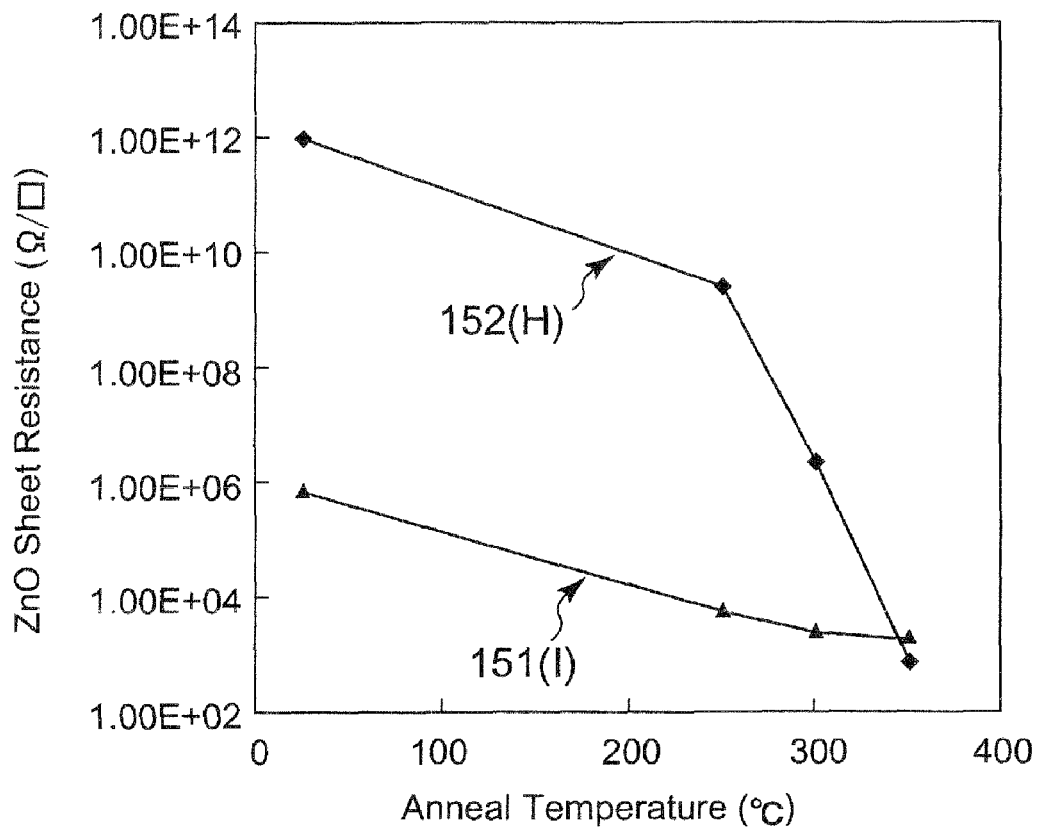
FIG. 15 is a graph showing the dependency of the sheet resistance of ion-doped zinc oxide thin films on the heating treatment temperature, comparing the zinc oxide thin films of different lattice spacings.
Figure 16:
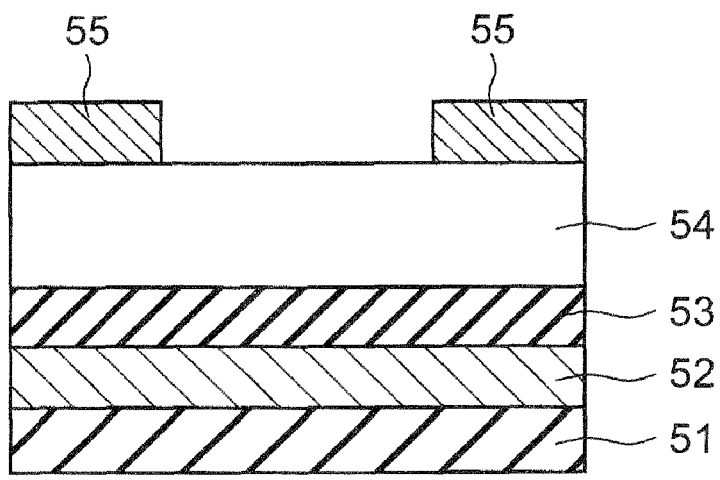
FIG. 16 is a graph showing the structure of a conventional bottom gate thin film transistor.

Lastly, thin film transistors including an ion-doped oxide semiconductor thin film layer as described in the third to sixth embodiments were tested. FIG. 15 is a graph showing the heat resistance of ion-doped zinc oxide thin films.

In FIG. 15, curves 151 and 152 respectively indicate the heat resistance of a zinc oxide thin film (thin film I) having a lattice spacing $d_{002}$ of 2.605 Å and of a zinc oxide thin film (thin film H) having a lattice spacing $d_{002}$ of 2.636 Å, both of which were doped with gallium (Ga) ions. The thin films were heat-treated for 2 hours in a vacuum. After the sample temperature fell below 200° C., the thin films were subjected to the atmosphere. FIG. 15 shows the sheet resistivity of the thin films measured after the subjection to the atmosphere. The vertical scale plots sheet resistivity whereas the horizontal scale plots anneal temperature.

In the doping of gallium, $1 \times 10^{15}/cm^2$ accelerated gallium ions with 80 keV energy were doped without heating.

The resistance of the zinc oxide thin film having a lattice spacing $d_{002}$ of 2.605 Å, which is similar to the lattice spacing $d_{002}$ of zinc oxide single crystal, decreases right after the ion doping (see curve 151 in FIG. 15).

The resistance of the zinc oxide thin film having a lattice spacing $d_{002}$ of 2.636 Å does not significantly decrease after the ion-doping.

However, a heat treatment after the ion-doping reduces the resistance of the zinc oxide thin film having a lattice spacing $d_{002}$ of 2.636 Å (see curve 152 in FIG. 15). As described by curve 134 in FIG. 13, the non ion-doped zinc oxide thin film maintains a high resistance until around 250° C. The heat treatment causes a difference between the resistance of the ion-doped zinc oxide thin film and the resistance of the non ion-doped zinc oxide thin film. Specifically, a heat treatment at around 200 to 250° C. allows the resistance of the ion-doped zinc oxide to be maintained at a high level (as indicated by curve 134 in FIG. 13) while reducing the resistance of the non ion-doped zinc oxide to a sufficiently lower level than the resistance of the ion-doped zinc oxide (as indicated by curve 152 in FIG. 15).

If a thin film transistor is formed to include an oxide semiconductor thin film layer having a large lattice spacing $d_{002}$, it is not sufficient to dope ions in order to reduce the resistance of the oxide semiconductor thin film layer such that a pair of source/drain regions are appropriately formed. An activation treatment (e.g., heat treatement) is further used to reduce the resistance of only the ion-doped area such that a pair of source/drain regions are appropriately formed. In addition, the non ion-doped area (i.e., channel area) maintains a high resistance through the activation treatment such that a thin film transistor with a high current driving capability is provided.

At a lattice spacing $d_{002}$ of 2.605 Å, a heat treatment at 200° C. or above results in a decrease in the resistance of both the ion-doped zinc oxide (see curve 151 in FIG. 15) and the non ion-doped zinc oxide (see curve 131 in FIG. 13). As a result, it is not possible to maintain a high resistance of the channel region so as to form a thin film transistor with a high current driving capability at a lattice spacing $d_{002}$ of 2.605 Å.

The rate of decrease in the resistance caused by the heat treatment after the ion-doping depends on the amount of doped ions, the type of doped ions, or the heat treatment.

As described above, the semiconductor device including a semiconductor thin film layer of zinc oxide according to the present invention exhibits an excellent performance and is suitably used as a driving element in, for example, a liquid crystal display device and the like.

What is claimed is:

1. A manufacturing method of a semiconductor device comprising:
    providing a substrate;
    depositing an oxide semiconductor thin film layer comprising zinc oxide on the substrate as a semiconductor layer of a thin film transistor;
    depositing a layer comprising one of $SiO_x$, SiON, and SiN as a gate insulating film of the thin film transistor on the oxide semiconductor thin film layer;
    wherein the oxide semiconductor thin film layer is deposited such that at least a predetermined portion of the oxide semiconductor thin film layer includes (002) lattice planes having a preferred orientation along a direction perpendicular to the substrate and a lattice spacing $d_{002}$ of at least 2.619 Å.

2. The manufacturing method according to claim 1, wherein the entire oxide semiconductor thin film layer includes (002) lattice planes having the preferred orientation along the direction perpendicular to the substrate.

3. The manufacturing method according to claim 1, wherein a portion of the oxide semiconductor thin film layer which is in contact with the substrate corresponds to a channel of the thin film transistor.

4. The manufacturing method according to claim 1, wherein the lattice spacing $d_{002}$ of the (002) lattice planes of the oxide semiconductor thin film layer in at least the predetermined portion is at least 2.625 Å.

5. The manufacturing method according to claim 1, wherein the predetermined portion is a portion corresponding to a channel of the thin film transistor.

6. The manufacturing method according to claim 1, wherein the oxide semiconductor thin film layer is deposited by magnetron sputtering.

* * * * *